(12) United States Patent
Satpathy et al.

(10) Patent No.: US 10,042,644 B2
(45) Date of Patent: *Aug. 7, 2018

(54) METHOD AND APPARATUS FOR SPECULATIVE DECOMPRESSION

(71) Applicant: Intel Corporation, Santa Clara, CA (US)

(72) Inventors: Sudhir K. Satpathy, Hillsboro, OR (US); Sanu K. Mathew, Hillsboro, OR (US); Vinodh Gopal, Westborough, MA (US); James D. Guilford, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/371,091

(22) Filed: Dec. 6, 2016

(65) Prior Publication Data
US 2017/0235576 A1  Aug. 17, 2017

Related U.S. Application Data

(63) Continuation of application No. 14/698,486, filed on Apr. 28, 2015, now Pat. No. 9,513,919.

(51) Int. Cl.
*H03M 7/40* (2006.01)
*G06F 9/30* (2018.01)
*H03M 7/30* (2006.01)

(52) U.S. Cl.
CPC ........ *G06F 9/30185* (2013.01); *G06F 9/3016* (2013.01); *G06F 9/30021* (2013.01); *G06F 9/30156* (2013.01); *H03M 7/4037* (2013.01); *H03M 7/6005* (2013.01); *H03M 7/6023* (2013.01)

(58) Field of Classification Search
CPC .... G06F 9/30196; G06F 9/30156; G03F 9/30; H03M 7/40
USPC ........................................ 341/50, 51, 65, 67
See application file for complete search history.

(56) References Cited

U.S. PATENT DOCUMENTS

| 6,020,920 | A | 2/2000 | Anderson |
| 2015/0006862 | A1 | 1/2015 | Gschwind et al. |
| 2015/0220845 | A1 | 8/2015 | Goyal et al. |

OTHER PUBLICATIONS

Jang et al., "Practical Speculative Parallelization of Variable Length Decompression Algorithms," pp. 55-64, Jun. 2013.
Non-Final Office Action from U.S. Appl. No. 14/698,486, dated Apr. 4, 2016, 5 pages.
Notice of Allowance from U.S. Appl. No. 14/698,486, dated Aug. 12, 2016, 6 pages.

*Primary Examiner* — Peguy Jean Pierre
(74) *Attorney, Agent, or Firm* — Nicholson De Vos Webster & Elliott LLP

(57) ABSTRACT

An apparatus and method for performing parallel decoding of prefix codes such as Huffman codes. For example, one embodiment of an apparatus comprises: a first decompression module to perform a non-speculative decompression of a first portion of a prefix code payload comprising a first plurality of symbols; and a second decompression module to perform speculative decompression of a second portion of the prefix code payload comprising a second plurality of symbols concurrently with the non-speculative decompression performed by the first compression module.

17 Claims, 25 Drawing Sheets

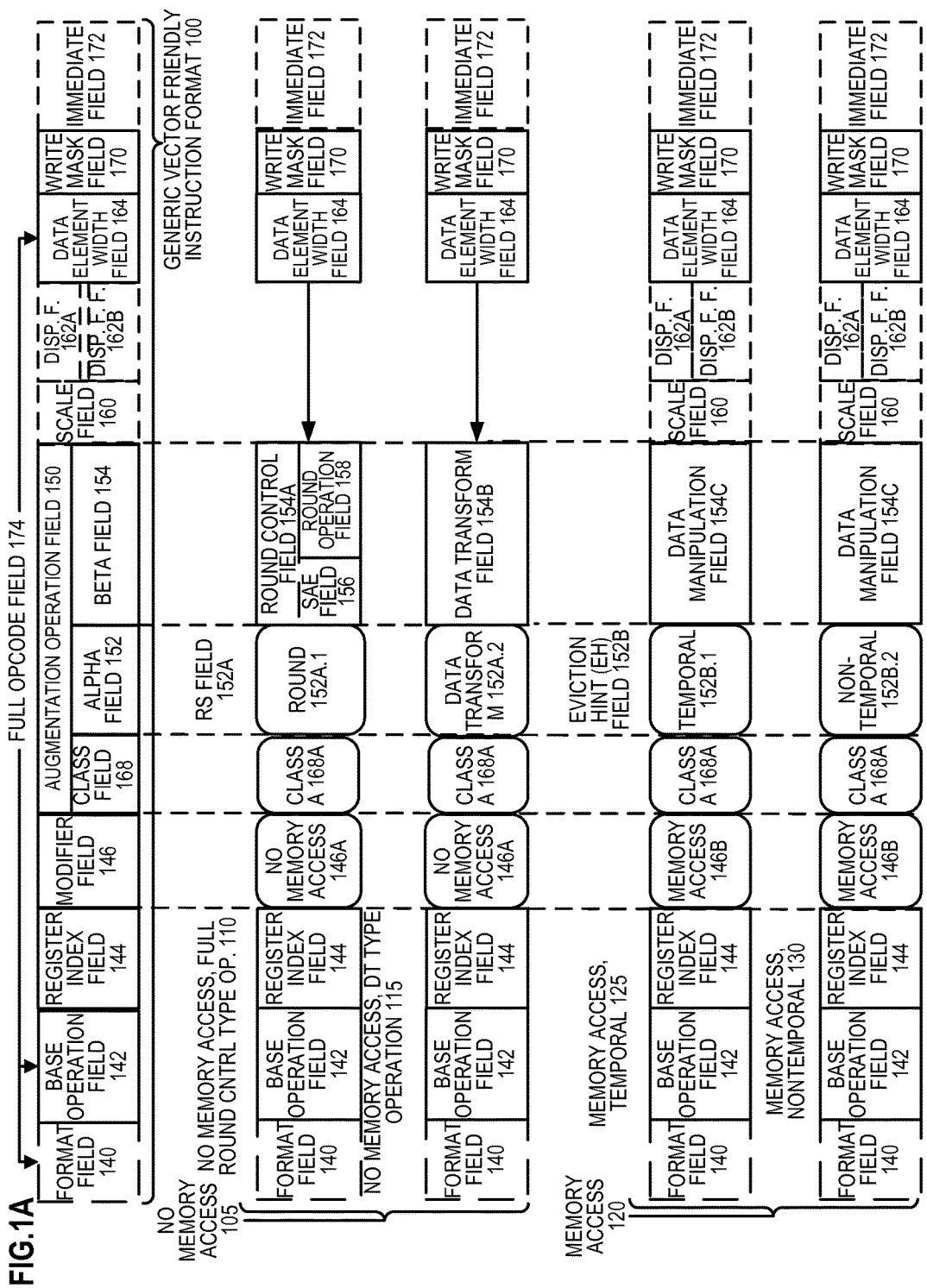

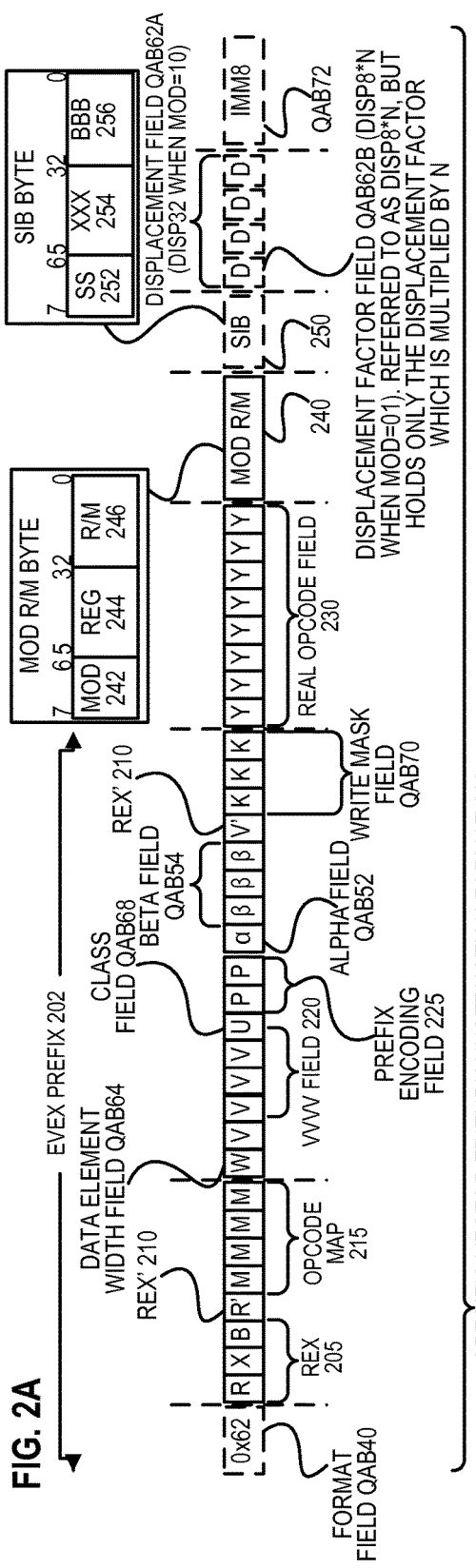
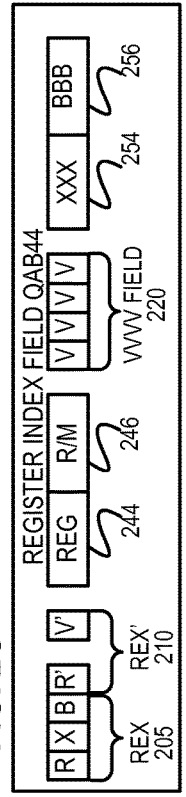
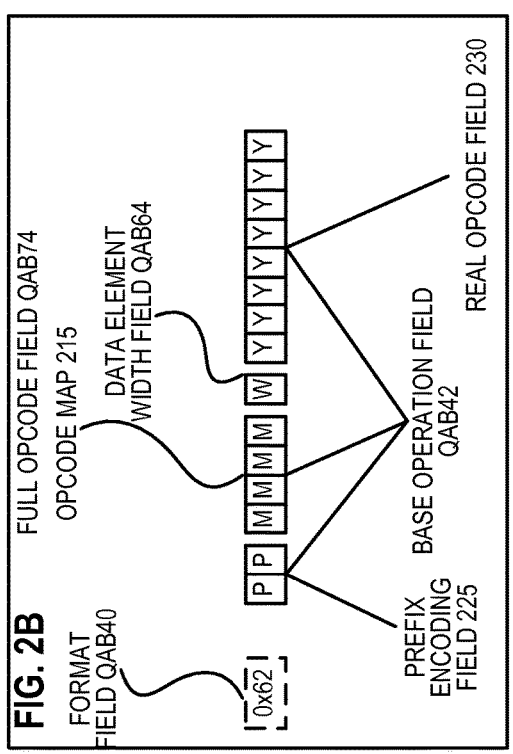
FIG. 2A
FIG. 2B
FIG. 2C

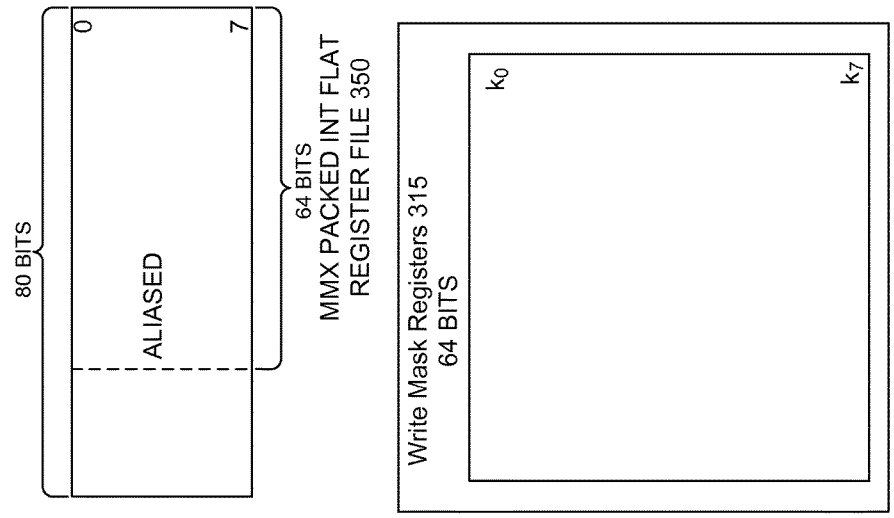
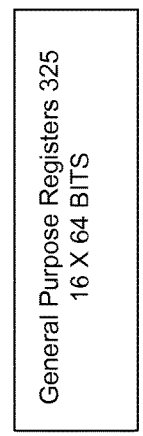
FIG. 3

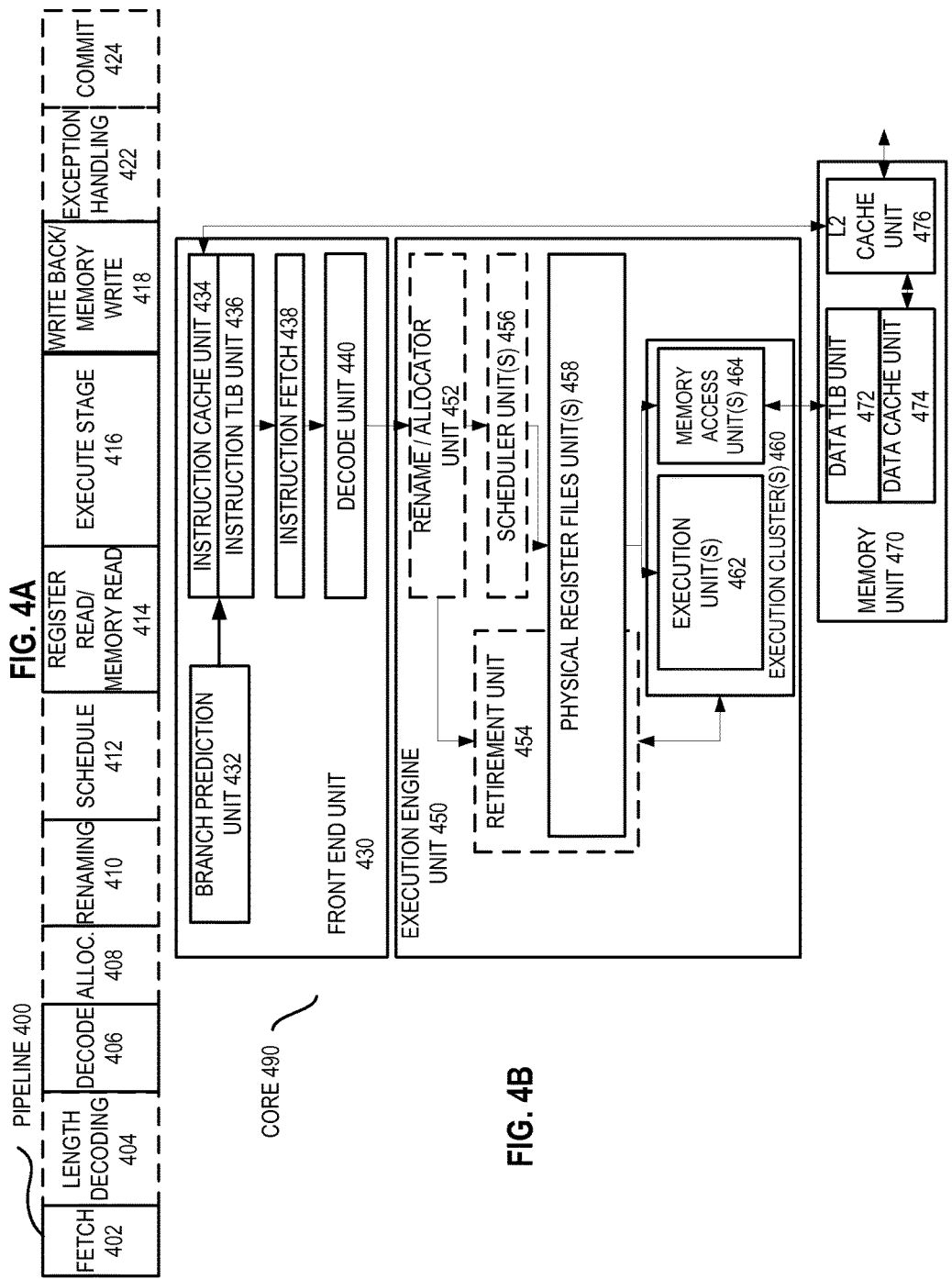

US 10,042,644 B2

METHOD AND APPARATUS FOR SPECULATIVE DECOMPRESSION

CROSS-REFERENCE TO RELATED APPLICATIONS

The present patent application is a continuation application claiming priority from U.S. patent application Ser. No. 14/698,486, filed Apr. 28, 2015, and titled: "Method and Apparatus for Speculative Decompression", which is incorporated herein by reference in its entirety.

This invention was made with Government support under contract number H98230-11-3-0011 awarded by the Department of Defense. The Government has certain rights in this invention.

BACKGROUND

Field of the Invention

This invention relates generally to the field of computer processors. More particularly, the invention relates to a method and apparatus for speculative decompression.

Description of the Related Art

An instruction set, or instruction set architecture (ISA), is the part of the computer architecture related to programming, including the native data types, instructions, register architecture, addressing modes, memory architecture, interrupt and exception handling, and external input and output (I/O). It should be noted that the term "instruction" generally refers herein to macro-instructions—that is instructions that are provided to the processor for execution—as opposed to micro-instructions or micro-ops—that is the result of a processor's decoder decoding macro-instructions. The micro-instructions or micro-ops can be configured to instruct an execution unit on the processor to perform operations to implement the logic associated with the macro-instruction.

The ISA is distinguished from the microarchitecture, which is the set of processor design techniques used to implement the instruction set. Processors with different microarchitectures can share a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. For example, the same register architecture of the ISA may be implemented in different ways in different microarchitectures using well-known techniques, including dedicated physical registers, one or more dynamically allocated physical registers using a register renaming mechanism (e.g., the use of a Register Alias Table (RAT), a Reorder Buffer (ROB) and a retirement register file). Unless otherwise specified, the phrases register architecture, register file, and register are used herein to refer to that which is visible to the software/programmer and the manner in which instructions specify registers. Where a distinction is required, the adjective "logical," "architectural," or "software visible" will be used to indicate registers/files in the register architecture, while different adjectives will be used to designate registers in a given microarchitecture (e.g., physical register, reorder buffer, retirement register, register pool).

An instruction set includes one or more instruction formats. A given instruction format defines various fields (number of bits, location of bits) to specify, among other things, the operation to be performed and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. A given instruction is expressed using a given instruction format (and, if defined, in a given one of the instruction templates of that instruction format) and specifies the operation and the operands. An instruction stream is a specific sequence of instructions, where each instruction in the sequence is an occurrence of an instruction in an instruction format (and, if defined, a given one of the instruction templates of that instruction format).

BRIEF DESCRIPTION OF THE DRAWINGS

A better understanding of the present invention can be obtained from the following detailed description in conjunction with the following drawings, in which:

FIGS. 1A and 1B are block diagrams illustrating a generic vector friendly instruction format and instruction templates thereof according to embodiments of the invention;

FIG. 2A-D is a block diagram illustrating an exemplary specific vector friendly instruction format according to embodiments of the invention;

FIG. 3 is a block diagram of a register architecture according to one embodiment of the invention; and FIG. 4A is a block diagram illustrating both an exemplary in-order fetch, decode, retire pipeline and an exemplary register renaming, out-of-order issue/execution pipeline according to embodiments of the invention;

FIG. 4B is a block diagram illustrating both an exemplary embodiment of an in-order fetch, decode, retire core and an exemplary register renaming, out-of-order issue/execution architecture core to be included in a processor according to embodiments of the invention;

DETAILED DESCRIPTION

Figure 1B:
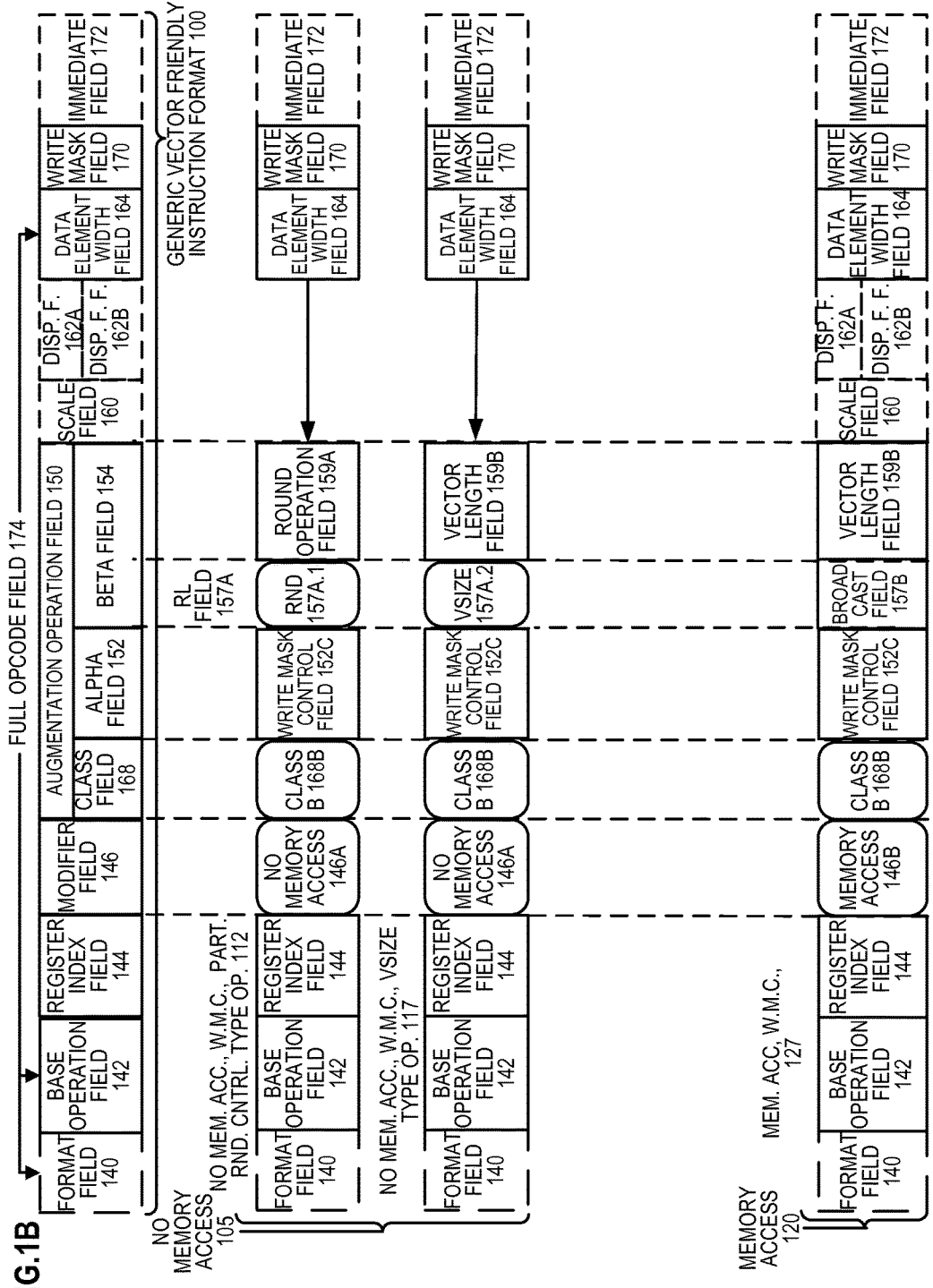

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Processor Architectures and Data Types

An instruction set includes one or more instruction formats. A given instruction format defines various fields (number of bits, location of bits) to specify, among other things, the operation to be performed (opcode) and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to the Advanced Vector Extensions (AVX) (AVX1 and AVX2) and using the Vector Extensions (VEX) coding scheme, has been, has been released and/or published (e.g., see Intel® 64 and IA-32 Architectures Software Developers Manual, October 2011; and see Intel® Advanced Vector Extensions Programming Reference, June 2011).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

A. Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

FIGS. 1A-1B are block diagrams illustrating a generic vector friendly instruction format and instruction templates thereof according to embodiments of the invention. FIG. 1A is a block diagram illustrating a generic vector friendly instruction format and class A instruction templates thereof according to embodiments of the invention; while FIG. 1B is a block diagram illustrating the generic vector friendly instruction format and class B instruction templates thereof according to embodiments of the invention. Specifically, a generic vector friendly instruction format 100 for which are defined class A and class B instruction templates, both of which include no memory access 105 instruction templates and memory access 120 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 1A include: 1) within the no memory access 105 instruction templates there is shown a no memory access, full round control type operation 110 instruction template and a no memory access, data transform type operation 115 instruction template; and 2) within the memory access 120 instruction templates there is shown a memory access, temporal 125 instruction template and a memory access, non-temporal 130 instruction template. The class B instruction templates in FIG. 1B include: 1) within the no memory access 105 instruction templates there is shown a no memory access, write mask control, partial round control type operation 112 instruction template and a no memory access, write mask control, vsize type operation 117 instruction template; and 2) within the memory access 120 instruction templates there is shown a memory access, write mask control 127 instruction template.

The generic vector friendly instruction format 100 includes the following fields listed below in the order illustrated in FIGS. 1A-1B.

Format field 140—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 142—its content distinguishes different base operations.

Register index field 144—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 146—its content distinguishes occurrences of instructions in the generic vector instruction format that specify memory access from those that do not; that is, between no memory access 105 instruction templates and memory access 120 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 150—its content distinguishes which one of a variety of different operations to be performed in addition to the base operation. This field is context specific. In one embodiment of the invention, this field is divided into a class field 168, an alpha field 152, and a beta field 154. The augmentation operation field 150 allows common groups of operations to be performed in a single instruction rather than 2, 3, or 4 instructions.

Scale field 160—its content allows for the scaling of the index field's content for memory address generation (e.g., for address generation that uses $2^{scale}$*index+base).

Displacement Field 162A—its content is used as part of memory address generation (e.g., for address generation that uses $2^{scale}$*index+base+displacement).

Displacement Factor Field 162B (note that the juxtaposition of displacement field 162A directly over displacement factor field 162B indicates one or the other is used)—its content is used as part of address generation; it specifies a displacement factor that is to be scaled by the size of a memory access (N)—where N is the number of bytes in the memory access (e.g., for address generation that uses $2^{scale}$*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 174 (described later herein) and the data manipulation field 154C. The displacement field 162A and the displacement factor field 162B are optional in the sense that they are not used for the no memory access 105 instruction templates and/or different embodiments may implement only one or none of the two.

Data element width field 164—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 170—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 170 allows for partial vector operations, including loads, stores, arithmetic, logical, etc. While embodiments of the invention are described in which the write mask field's 170 content selects one of a number of write mask registers that contains the write mask to be used (and thus the write mask field's 170 content indirectly identifies that masking to be performed), alternative embodiments instead or additional allow the mask write field's 170 content to directly specify the masking to be performed.

Immediate field 172—its content allows for the specification of an immediate. This field is optional in the sense that is it not present in an implementation of the generic vector friendly format that does not support immediate and it is not present in instructions that do not use an immediate.

Class field 168—its content distinguishes between different classes of instructions. With reference to FIGS. 1A-B, the contents of this field select between class A and class B instructions. In FIGS. 1A-B, rounded corner squares are used to indicate a specific value is present in a field (e.g., class A 168A and class B 168B for the class field 168 respectively in FIGS. 1A-B).

Instruction Templates of Class A

In the case of the non-memory access 105 instruction templates of class A, the alpha field 152 is interpreted as an RS field 152A, whose content distinguishes which one of the different augmentation operation types are to be performed (e.g., round 152A.1 and data transform 152A.2 are respectively specified for the no memory access, round type operation 110 and the no memory access, data transform type operation 115 instruction templates), while the beta field 154 distinguishes which of the operations of the specified type is to be performed. In the no memory access 105 instruction templates, the scale field 160, the displacement field 162A, and the displacement scale filed 162B are not present.

No-Memory Access Instruction Templates—Full Round Control Type Operation

In the no memory access full round control type operation 110 instruction template, the beta field 154 is interpreted as a round control field 154A, whose content(s) provide static rounding. While in the described embodiments of the invention the round control field 154A includes a suppress all floating point exceptions (SAE) field 156 and a round operation control field 158, alternative embodiments may support may encode both these concepts into the same field or only have one or the other of these concepts/fields (e.g., may have only the round operation control field 158).

SAE field 156—its content distinguishes whether or not to disable the exception event reporting; when the SAE field's 156 content indicates suppression is enabled, a given instruction does not report any kind of floating-point exception flag and does not raise any floating point exception handler.

Round operation control field 158—its content distinguishes which one of a group of rounding operations to perform (e.g., Round-up, Round-down, Round-towards-zero and Round-to-nearest). Thus, the round operation control field 158 allows for the changing of the rounding mode on a per instruction basis. In one embodiment of the invention where a processor includes a control register for specifying rounding modes, the round operation control field's 150 content overrides that register value.

No Memory Access Instruction Templates—Data Transform Type Operation

In the no memory access data transform type operation 115 instruction template, the beta field 154 is interpreted as a data transform field 154B, whose content distinguishes which one of a number of data transforms is to be performed (e.g., no data transform, swizzle, broadcast).

In the case of a memory access 120 instruction template of class A, the alpha field 152 is interpreted as an eviction hint field 152B, whose content distinguishes which one of the eviction hints is to be used (in FIG. 1A, temporal 152B.1 and non-temporal 152B.2 are respectively specified for the memory access, temporal 125 instruction template and the memory access, non-temporal 130 instruction template), while the beta field 154 is interpreted as a data manipulation field 154C, whose content distinguishes which one of a number of data manipulation operations (also known as primitives) is to be performed (e.g., no manipulation; broadcast; up conversion of a source; and down conversion of a destination). The memory access 120 instruction templates include the scale field 160, and optionally the displacement field 162A or the displacement scale field 162B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 152 is interpreted as a write mask control (Z) field 152C, whose content distinguishes whether the write masking controlled by the write mask field 170 should be a merging or a zeroing.

In the case of the non-memory access 105 instruction templates of class B, part of the beta field 154 is interpreted as an RL field 157A, whose content distinguishes which one of the different augmentation operation types are to be performed (e.g., round 157A.1 and vector length (VSIZE) 157A.2 are respectively specified for the no memory access, write mask control, partial round control type operation 112 instruction template and the no memory access, write mask control, VSIZE type operation 117 instruction template), while the rest of the beta field 154 distinguishes which of the operations of the specified type is to be performed. In the no memory access 105 instruction templates, the scale field 160, the displacement field 162A, and the displacement scale filed 162B are not present.

In the no memory access, write mask control, partial round control type operation 110 instruction template, the rest of the beta field 154 is interpreted as a round operation field 159A and exception event reporting is disabled (a given instruction does not report any kind of floating-point exception flag and does not raise any floating point exception handler).

Round operation control field 159A—just as round operation control field 158, its content distinguishes which one of a group of rounding operations to perform (e.g., Round-up, Round-down, Round-towards-zero and Round-to-nearest). Thus, the round operation control field 159A allows for the changing of the rounding mode on a per instruction basis. In one embodiment of the invention where a processor includes a control register for specifying rounding modes, the round operation control field's 150 content overrides that register value.

In the no memory access, write mask control, VSIZE type operation 117 instruction template, the rest of the beta field 154 is interpreted as a vector length field 159B, whose content distinguishes which one of a number of data vector lengths is to be performed on (e.g., 128, 256, or 512 byte).

In the case of a memory access 120 instruction template of class B, part of the beta field 154 is interpreted as a broadcast field 157B, whose content distinguishes whether or not the broadcast type data manipulation operation is to be performed, while the rest of the beta field 154 is interpreted the vector length field 159B. The memory access 120 instruction templates include the scale field 160, and optionally the displacement field 162A or the displacement scale field 162B.

With regard to the generic vector friendly instruction format 100, a full opcode field 174 is shown including the format field 140, the base operation field 142, and the data element width field 164. While one embodiment is shown where the full opcode field 174 includes all of these fields, the full opcode field 174 includes less than all of these fields in embodiments that do not support all of them. The full opcode field 174 provides the operation code (opcode).

The augmentation operation field 150, the data element width field 164, and the write mask field 170 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

B. Exemplary Specific Vector Friendly Instruction Format

FIG. 2 is a block diagram illustrating an exemplary specific vector friendly instruction format according to embodiments of the invention. FIG. 2 shows a specific vector friendly instruction format 200 that is specific in the sense that it specifies the location, size, interpretation, and order of the fields, as well as values for some of those fields. The specific vector friendly instruction format 200 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 1 into which the fields from FIG. 2 map are illustrated.

It should be understood that, although embodiments of the invention are described with reference to the specific vector friendly instruction format 200 in the context of the generic vector friendly instruction format 100 for illustrative purposes, the invention is not limited to the specific vector friendly instruction format 200 except where claimed. For example, the generic vector friendly instruction format 100 contemplates a variety of possible sizes for the various fields, while the specific vector friendly instruction format 200 is shown as having fields of specific sizes. By way of specific example, while the data element width field 164 is illustrated as a one bit field in the specific vector friendly instruction format 200, the invention is not so limited (that is, the generic vector friendly instruction format 100 contemplates other sizes of the data element width field 164).

The generic vector friendly instruction format 100 includes the following fields listed below in the order illustrated in FIG. 2A.

EVEX Prefix (Bytes 0-3) 202—is encoded in a four-byte form.

Format Field 140 (EVEX Byte 0, bits [7:0])—the first byte (EVEX Byte 0) is the format field 140 and it contains 0x62 (the unique value used for distinguishing the vector friendly instruction format in one embodiment of the invention).

The second-fourth bytes (EVEX Bytes 1-3) include a number of bit fields providing specific capability.

REX field 205 (EVEX Byte 1, bits [7-5])—consists of a EVEX.R bit field (EVEX Byte 1, bit [7]—R), EVEX.X bit field (EVEX byte 1, bit [6]—X), and 157BEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 110—this is the first part of the REX' field 110 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 215 (EVEX byte 1, bits [3:0]—mmmm)—its content encodes an implied leading opcode byte (0F, 0F 38, or 0F 3).

Data element width field 164 (EVEX byte 2, bit [7]—W)—is represented by the notation EVEX.W. EVEX.W is used to define the granularity (size) of the datatype (either 32-bit data elements or 64-bit data elements).

EVEX.vvvv 220 (EVEX Byte 2, bits [6:3]-vvvv)—the role of EVEX.vvvv may include the following: 1) EVEX.vvvv encodes the first source register operand, specified in inverted (1 s complement) form and is valid for instructions with 2 or more source operands; 2) EVEX.vvvv encodes the destination register operand, specified in 1 s complement form for certain vector shifts; or 3) EVEX.vvvv does not encode any operand, the field is reserved and should contain 1111b. Thus, EVEX.vvvv field 220 encodes the 4 low-order bits of the first source register specifier stored in inverted (1 s complement) form. Depending on the instruction, an extra different EVEX bit field is used to extend the specifier size to 32 registers.

EVEX.U 168 Class field (EVEX byte 2, bit [2]-U)—If EVEX.U=0, it indicates class A or EVEX.U0; if EVEX.U=1, it indicates class B or EVEX.U1.

Prefix encoding field 225 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 152 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 154 (EVEX byte 3, bits [6:4]-SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 110—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 170 (EVEX byte 3, bits [2:0]-kkk)—its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 230 (Byte 4) is also known as the opcode byte. Part of the opcode is specified in this field.

MOD R/M Field 240 (Byte 5) includes MOD field 242, Reg field 244, and R/M field 246. As previously described, the MOD field's 242 content distinguishes between memory access and non-memory access operations. The role of Reg field 244 can be summarized to two situations: encoding either the destination register operand or a source register operand, or be treated as an opcode extension and not used to encode any instruction operand. The role of R/M field 246 may include the following: encoding the instruction operand that references a memory address, or encoding either the destination register operand or a source register operand.

Scale, Index, Base (SIB) Byte (Byte 6)—As previously described, the scale field's 150 content is used for memory address generation. SIB.xxx 254 and SIB.bbb 256—the contents of these fields have been previously referred to with regard to the register indexes Xxxx and Bbbb.

Displacement field 162A (Bytes 7-10)—when MOD field 242 contains 10, bytes 7-10 are the displacement field 162A, and it works the same as the legacy 32-bit displacement (disp32) and works at byte granularity.

Displacement factor field 162B (Byte 7)—when MOD field 242 contains 01, byte 7 is the displacement factor field 162B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 162B is a reinterpretation of disp8; when using displacement factor field 162B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 162B substitutes the legacy x86 instruction set 8-bit displacement. Thus, the displacement factor field 162B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate field 172 operates as previously described.

Full Opcode Field

FIG. 2B is a block diagram illustrating the fields of the specific vector friendly instruction format 200 that make up the full opcode field 174 according to one embodiment of the invention. Specifically, the full opcode field 174 includes the format field 140, the base operation field 142, and the data element width (W) field 164. The base operation field 142 includes the prefix encoding field 225, the opcode map field 215, and the real opcode field 230.

Register Index Field

FIG. 2C is a block diagram illustrating the fields of the specific vector friendly instruction format 200 that make up the register index field 144 according to one embodiment of the invention. Specifically, the register index field 144 includes the REX field 205, the REX' field 210, the MODR/M.reg field 244, the MODR/M.r/m field 246, the VVVV field 220, xxx field 254, and the bbb field 256.

Augmentation Operation Field

Figure 2D:
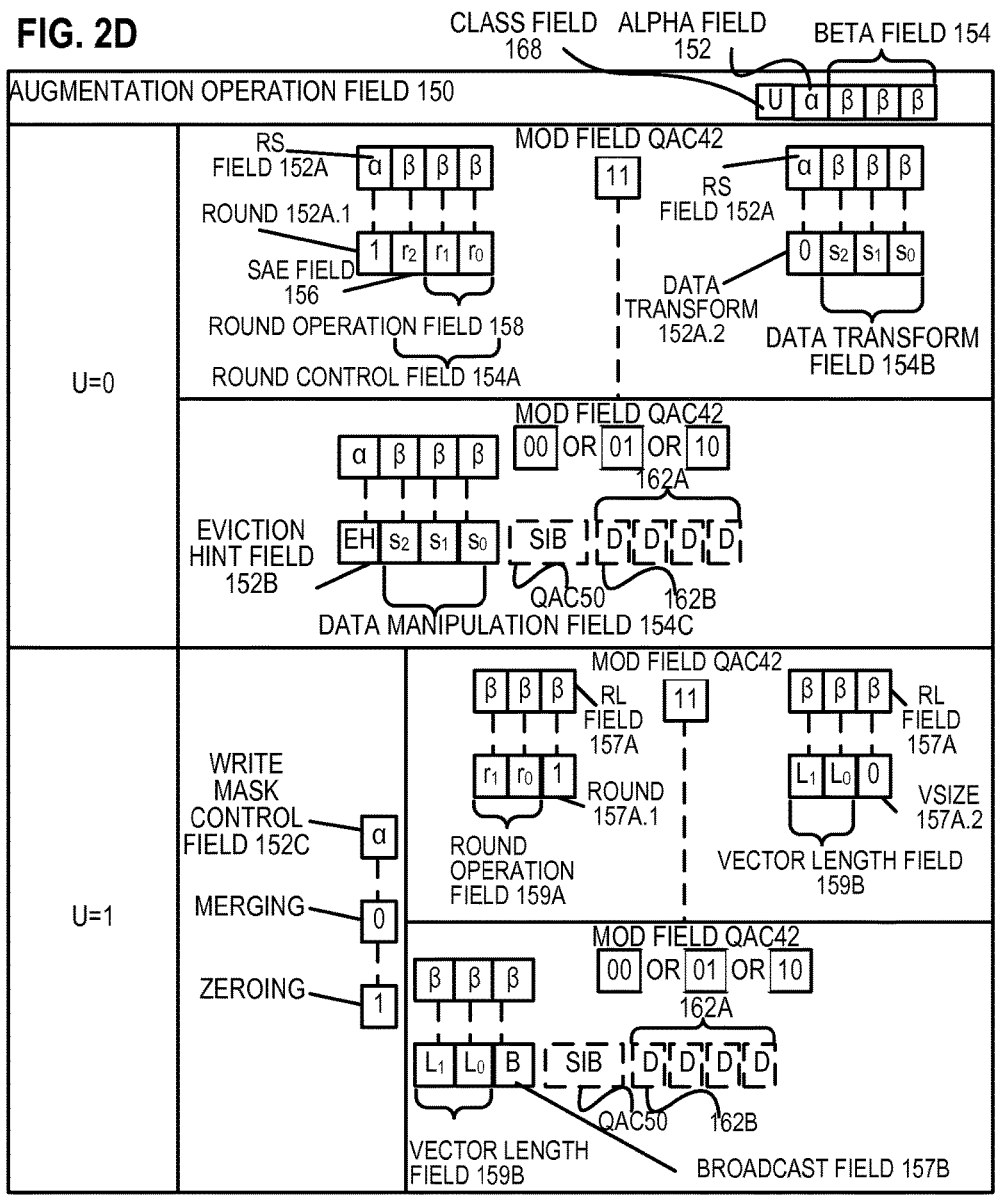

FIG. 2D is a block diagram illustrating the fields of the specific vector friendly instruction format 200 that make up the augmentation operation field 150 according to one embodiment of the invention. When the class (U) field 168 contains 0, it signifies EVEX.U0 (class A 168A); when it contains 1, it signifies EVEX.U1 (class B 168B). When U=0 and the MOD field 242 contains 11 (signifying a no memory access operation), the alpha field 152 (EVEX byte 3, bit [7]—EH) is interpreted as the rs field 152A. When the rs field 152A contains a 1 (round 152A.1), the beta field 154 (EVEX byte 3, bits [6:4]—SSS) is interpreted as the round control field 154A. The round control field 154A includes a one bit SAE field 156 and a two bit round operation field 158. When the rs field 152A contains a 0 (data transform 152A.2), the beta field 154 (EVEX byte 3, bits [6:4]—SSS) is interpreted as a three bit data transform field 154B. When U=0 and the MOD field 242 contains 00, 01, or 10 (signifying a memory access operation), the alpha field 152 (EVEX byte 3, bit [7]—EH) is interpreted as the eviction hint (EH) field 152B and the beta field 154 (EVEX byte 3, bits [6:4]—SSS) is interpreted as a three bit data manipulation field 154C.

When U=1, the alpha field 152 (EVEX byte 3, bit [7]—EH) is interpreted as the write mask control (Z) field 152C. When U=1 and the MOD field 242 contains 11 (signifying a no memory access operation), part of the beta field 154 (EVEX byte 3, bit [4]—$S_0$) is interpreted as the RL field 157A; when it contains a 1 (round 157A.1) the rest of the beta field 154 (EVEX byte 3, bit [6-5]—$S_{2-1}$) is interpreted as the round operation field 159A, while when the RL field 157A contains a 0 (VSIZE 157.A2) the rest of the beta field 154 (EVEX byte 3, bit [6-5]—$S_{2-1}$) is interpreted as the vector length field 159B (EVEX byte 3, bit [6-5]—$L_{1-0}$). When U=1 and the MOD field 242 contains 00, 01, or 10 (signifying a memory access operation), the beta field 154 (EVEX byte 3, bits [6:4]—SSS) is interpreted as the vector length field 159B (EVEX byte 3, bit [6-5]—$L_{1-0}$) and the broadcast field 157B (EVEX byte 3, bit [4]—B).

C. Exemplary Register Architecture

FIG. 3 is a block diagram of a register architecture 300 according to one embodiment of the invention. In the embodiment illustrated, there are 32 vector registers 310 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 200 operates on these overlaid register file as illustrated in the below tables.

| Adjustable Vector Length | Class | Operations | Registers |
|---|---|---|---|
| Instruction Templates that do not include the vector length field 159B | A (FIG. 1A; U = 0) | 110, 115, 125, 130 | zmm registers (the vector length is 64 byte) |
| | B (FIG. 1B; U = 1) | 112 | zmm registers (the vector length is 64 byte) |
| Instruction templates that do include the vector length field 159B | B (FIG. 1B; U = 1) | 117, 127 | zmm, ymm, or xmm registers (the vector length is 64 byte, 32 byte, or 16 byte) depending on the vector length field 159B |

In other words, the vector length field 159B selects between a maximum length and one or more other shorter lengths, where each such shorter length is half the length of the preceding length; and instructions templates without the vector length field 159B operate on the maximum vector length. Further, in one embodiment, the class B instruction templates of the specific vector friendly instruction format 200 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 315—in the embodiment illustrated, there are 8 write mask registers (k0 through k7), each 64 bits in size. In an alternate embodiment, the write mask registers 315 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 325—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 345, on which is aliased the MMX packed integer flat register file 350—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

D. Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 4A is a block diagram illustrating both an exemplary in-order pipeline and an exemplary register renaming, out-of-order issue/execution pipeline according to embodiments of the invention. FIG. 4B is a block diagram illustrating both an exemplary embodiment of an in-order architecture core and an exemplary register renaming, out-of-order issue/execution architecture core to be included in a processor according to embodiments of the invention. The solid lined boxes in FIGS. 4A-B illustrate the in-order pipeline and in-order core, while the optional addition of the dashed lined boxes illustrates the register renaming, out-of-order issue/ execution pipeline and core. Given that the in-order aspect is a subset of the out-of-order aspect, the out-of-order aspect will be described.

In FIG. 4A, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

FIG. 4B shows processor core 490 including a front end unit 430 coupled to an execution engine unit 450, and both are coupled to a memory unit 470. The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, coprocessor core, general purpose computing graphics processing unit (GPGPU) core, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit 440 (or decoder) may decode instructions, and generate as an output one or more micro-operations, micro-code entry points, microinstructions, other instructions, or other control signals, which are decoded from, or which otherwise reflect, or are derived from, the original instructions. The decode unit 440 may be implemented using various different mechanisms. Examples of suitable mechanisms include, but are not limited to, look-up tables, hardware implementations, programmable logic arrays (PLAs), microcode read only memories (ROMs), etc. In one embodiment, the core 490 includes a microcode ROM or other medium that stores microcode for certain macroinstructions (e.g., in decode unit 440 or otherwise within the front end unit 430). The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point—status (e.g., an instruction pointer that is the address of the next instruction to be executed), etc. In one embodiment, the physical register file(s) unit 458 comprises a vector registers unit, a write mask registers unit, and a scalar registers unit. These register units may provide architectural vector registers, vector mask registers, and general purpose registers. The physical register file(s) unit(s) 458 is overlapped by the retirement unit 454 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The instruction cache unit 434 is further coupled to a level 2 (L2) cache unit 476 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424.

The core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 490 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 5B:
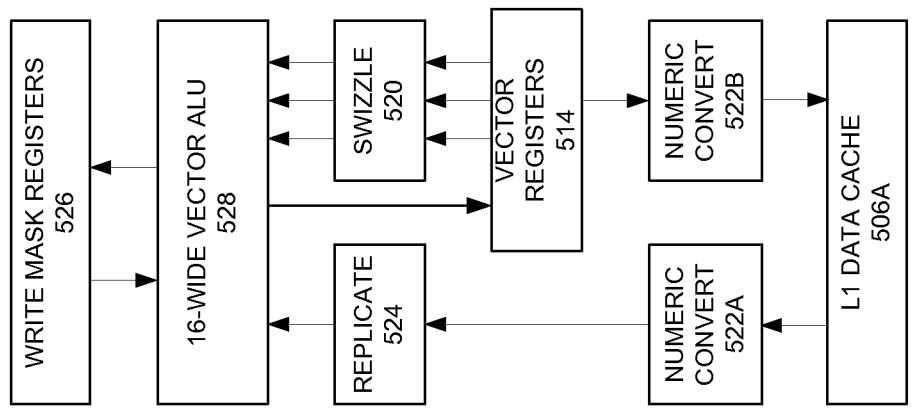
FIG. 5B illustrates an expanded view of part of the processor core in FIG. 5A according to embodiments of the invention.
Figure 5A:
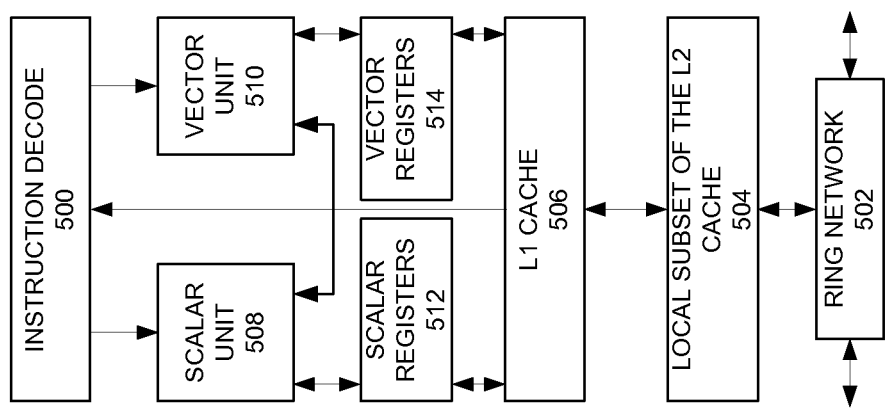
FIG. 5A is a block diagram of a single processor core, along with its connection to an on-die interconnect network.

FIGS. 5A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 5A is a block diagram of a single processor core, along with its connection to the on-die interconnect network 502 and with its local subset of the Level 2 (L2) cache 504, according to embodiments of the invention. In one embodiment, an instruction decoder 500 supports the x86 instruction set with a packed data instruction set extension. An L1 cache 506 allows low-latency accesses to cache memory into the scalar and vector units. While in one embodiment (to simplify the design), a scalar unit 508 and a vector unit 510 use separate register sets (respectively, scalar registers 512 and vector registers 514) and data transferred between them is written to memory and then read back in from a level 1 (L1) cache 506, alternative embodiments of the invention may use a different approach (e.g., use a single register set or include a communication path that allow data to be transferred between the two register files without being written and read back).

The local subset of the L2 cache 504 is part of a global L2 cache that is divided into separate local subsets, one per processor core. Each processor core has a direct access path to its own local subset of the L2 cache 504. Data read by a processor core is stored in its L2 cache subset 504 and can be accessed quickly, in parallel with other processor cores accessing their own local L2 cache subsets. Data written by a processor core is stored in its own L2 cache subset 504 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 5B is an expanded view of part of the processor core in FIG. 5A according to embodiments of the invention. FIG. 5B includes an L1 data cache 506A part of the L1 cache 504, as well as more detail regarding the vector unit 510 and the vector registers 514. Specifically, the vector unit 510 is a 16-wide vector processing unit (VPU) (see the 16-wide ALU 528), which executes one or more of integer, single-precision float, and double-precision float instructions. The VPU supports swizzling the register inputs with swizzle unit 520, numeric conversion with numeric convert units 522A-B, and replication with replication unit 524 on the memory input. Write mask registers 526 allow predicating resulting vector writes.

Figure 6:
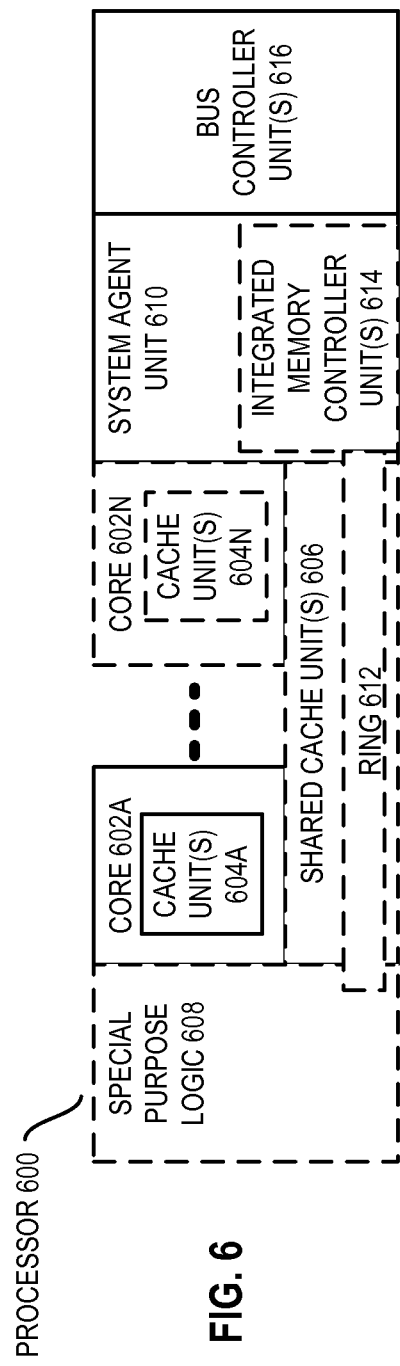
FIG. 6 is a block diagram of a single core processor and a multicore processor with integrated memory controller and graphics according to embodiments of the invention.

FIG. 6 is a block diagram of a processor 600 that may have more than one core, may have an integrated memory controller, and may have integrated graphics according to embodiments of the invention. The solid lined boxes in FIG. 6 illustrate a processor 600 with a single core 602A, a system agent 610, a set of one or more bus controller units 616, while the optional addition of the dashed lined boxes illustrates an alternative processor 600 with multiple cores 602A-N, a set of one or more integrated memory controller unit(s) 614 in the system agent unit 610, and special purpose logic 608.

Thus, different implementations of the processor 600 may include: 1) a CPU with the special purpose logic 608 being integrated graphics and/or scientific (throughput) logic (which may include one or more cores), and the cores 602A-N being one or more general purpose cores (e.g., general purpose in-order cores, general purpose out-of-order cores, a combination of the two); 2) a coprocessor with the cores 602A-N being a large number of special purpose cores intended primarily for graphics and/or scientific (throughput); and 3) a coprocessor with the cores 602A-N being a large number of general purpose in-order cores. Thus, the processor 600 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 606, and external memory (not shown) coupled to the set of integrated memory controller units 614. The set of shared cache units 606 may include one or more mid-level caches, such as level 2 (L2), level 3 (L3), level 4 (L4), or other levels of cache, a last level cache (LLC), and/or combinations thereof. While in one embodiment a ring based interconnect unit 612 interconnects the integrated graphics logic 608, the set of shared cache units 606, and the system agent unit 610/integrated memory controller unit(s) 614, alternative embodiments may use any number of well-known techniques for interconnecting such units. In one embodiment, coherency is maintained between one or more cache units 606 and cores 602-A-N.

In some embodiments, one or more of the cores 602A-N are capable of multithreading. The system agent 610 includes those components coordinating and operating cores 602A-N. The system agent unit 610 may include for example a power control unit (PCU) and a display unit. The PCU may be or include logic and components needed for regulating the power state of the cores 602A-N and the integrated graphics logic 608. The display unit is for driving one or more externally connected displays.

The cores 602A-N may be homogenous or heterogeneous in terms of architecture instruction set; that is, two or more of the cores 602A-N may be capable of execution the same instruction set, while others may be capable of executing only a subset of that instruction set or a different instruction set.

FIGS. 7-10 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 7:
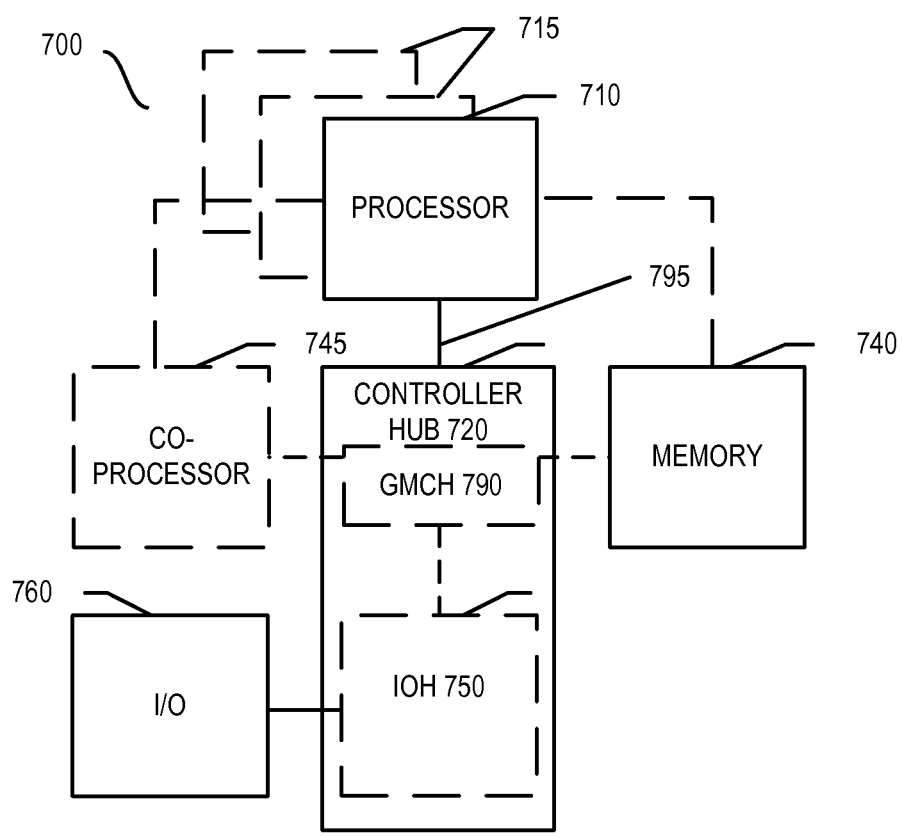
FIG. 7 illustrates a block diagram of a system in accordance with one embodiment of the present invention.

Referring now to FIG. 7, shown is a block diagram of a system 700 in accordance with one embodiment of the present invention. The system 700 may include one or more processors 710, 715, which are coupled to a controller hub 720. In one embodiment the controller hub 720 includes a graphics memory controller hub (GMCH) 790 and an Input/Output Hub (IOH) 750 (which may be on separate chips); the GMCH 790 includes memory and graphics controllers to which are coupled memory 740 and a coprocessor 745; the IOH 750 is couples input/output (I/O) devices 760 to the GMCH 790. Alternatively, one or both of the memory and graphics controllers are integrated within the processor (as described herein), the memory 740 and the coprocessor 745 are coupled directly to the processor 710, and the controller hub 720 in a single chip with the IOH 750.

The optional nature of additional processors 715 is denoted in FIG. 7 with broken lines. Each processor 710, 715 may include one or more of the processing cores described herein and may be some version of the processor 600.

The memory 740 may be, for example, dynamic random access memory (DRAM), phase change memory (PCM), or a combination of the two. For at least one embodiment, the controller hub 720 communicates with the processor(s) 710, 715 via a multi-drop bus, such as a frontside bus (FSB), point-to-point interface such as QuickPath Interconnect (QPI), or similar connection 795.

In one embodiment, the coprocessor 745 is a special-purpose processor, such as, for example, a high-throughput MIC processor, a network or communication processor, compression engine, graphics processor, GPGPU, embedded processor, or the like. In one embodiment, controller hub 720 may include an integrated graphics accelerator.

There can be a variety of differences between the physical resources 710, 715 in terms of a spectrum of metrics of merit including architectural, microarchitectural, thermal, power consumption characteristics, and the like.

In one embodiment, the processor 710 executes instructions that control data processing operations of a general type. Embedded within the instructions may be coprocessor instructions. The processor 710 recognizes these coprocessor instructions as being of a type that should be executed by the attached coprocessor 745. Accordingly, the processor 710 issues these coprocessor instructions (or control signals representing coprocessor instructions) on a coprocessor bus or other interconnect, to coprocessor 745. Coprocessor(s) 745 accept and execute the received coprocessor instructions.

Figure 8:
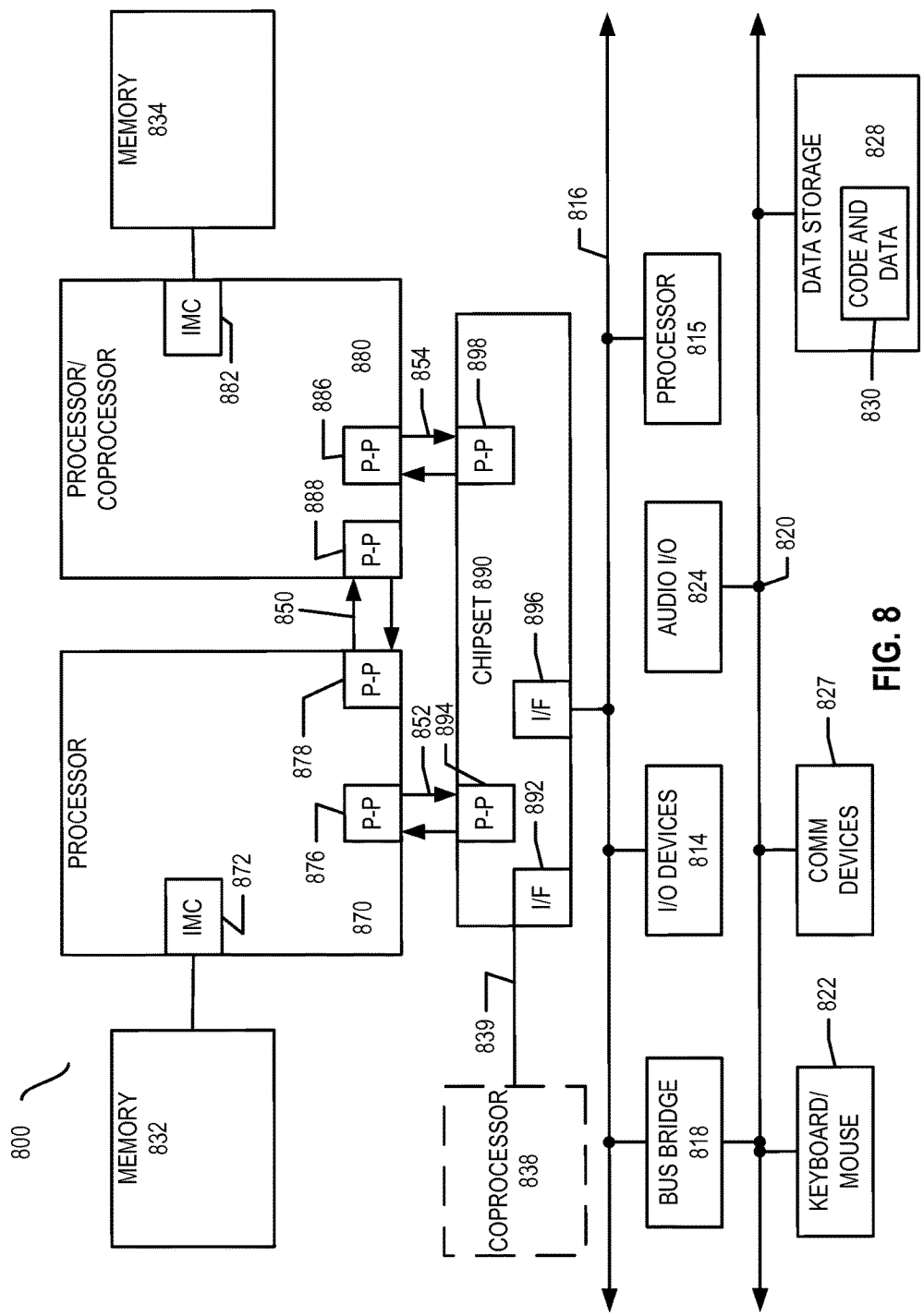
FIG. 8 illustrates a block diagram of a second system in accordance with an embodiment of the present invention.

Referring now to FIG. 8, shown is a block diagram of a first more specific exemplary system 800 in accordance with an embodiment of the present invention. As shown in FIG. 8, multiprocessor system 800 is a point-to-point interconnect system, and includes a first processor 870 and a second processor 880 coupled via a point-to-point interconnect 850. Each of processors 870 and 880 may be some version of the processor 600. In one embodiment of the invention, processors 870 and 880 are respectively processors 710 and 715, while coprocessor 838 is coprocessor 745. In another embodiment, processors 870 and 880 are respectively processor 710 coprocessor 745.

Processors 870 and 880 are shown including integrated memory controller (IMC) units 872 and 882, respectively. Processor 870 also includes as part of its bus controller units point-to-point (P-P) interfaces 876 and 878; similarly, second processor 880 includes P-P interfaces 886 and 888. Processors 870, 880 may exchange information via a point-to-point (P-P) interface 850 using P-P interface circuits 878, 888. As shown in FIG. 8, IMCs 872 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may optionally exchange information with the coprocessor 838 via a high-performance interface 839. In one embodiment, the coprocessor 838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a Peripheral Component Interconnect (PCI) bus, or a bus such as a PCI Express bus or another third generation I/O interconnect bus, although the scope of the present invention is not so limited.

As shown in FIG. 8, various I/O devices 814 may be coupled to first bus 816, along with a bus bridge 818 which couples first bus 816 to a second bus 820. In one embodiment, one or more additional processor(s) 815, such as coprocessors, high-throughput MIC processors, GPGPU's, accelerators (such as, e.g., graphics accelerators or digital signal processing (DSP) units), field programmable gate arrays, or any other processor, are coupled to first bus 816. In one embodiment, second bus 820 may be a low pin count (LPC) bus. Various devices may be coupled to a second bus 820 including, for example, a keyboard and/or mouse 822, communication devices 827 and a storage unit 828 such as a disk drive or other mass storage device which may include instructions/code and data 830, in one embodiment. Further, an audio I/O 824 may be coupled to the second bus 820. Note that other architectures are possible. For example, instead of the point-to-point architecture of FIG. 8, a system may implement a multi-drop bus or other such architecture.

Figure 9:
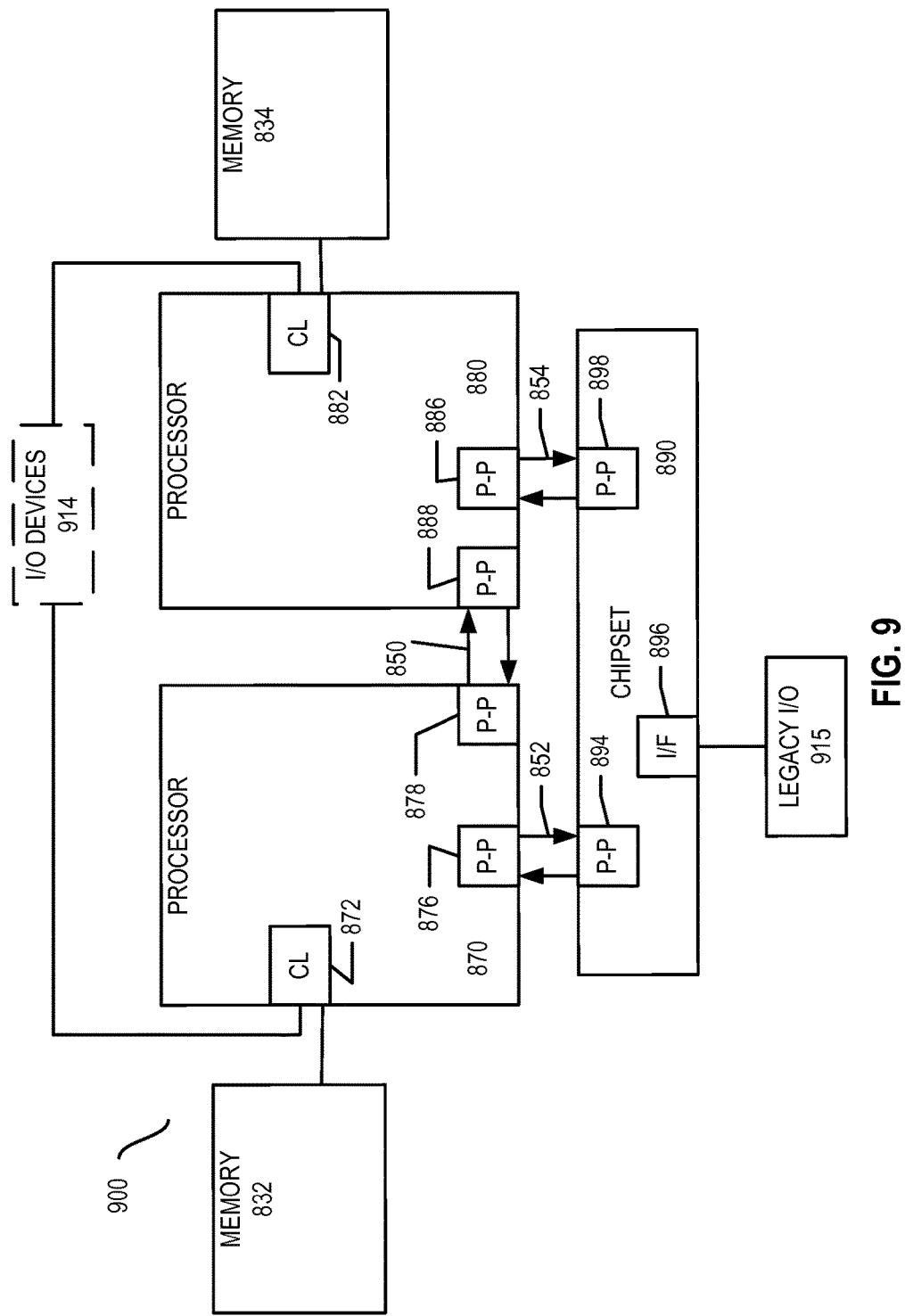
FIG. 9 illustrates a block diagram of a third system in accordance with an embodiment of the present invention.

Referring now to FIG. 9, shown is a block diagram of a second more specific exemplary system 900 in accordance with an embodiment of the present invention. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 870, 880 may include integrated memory and I/O control logic ("CL") 872 and 882, respectively. Thus, the CL 872, 882 include integrated memory controller units and include I/O control logic. FIG. 9 illustrates that not only are the memories 832, 834 coupled to the CL 872, 882, but also that I/O devices 914 are also coupled to the control logic 872, 882. Legacy I/O devices 915 are coupled to the chipset 890.

Figure 10:
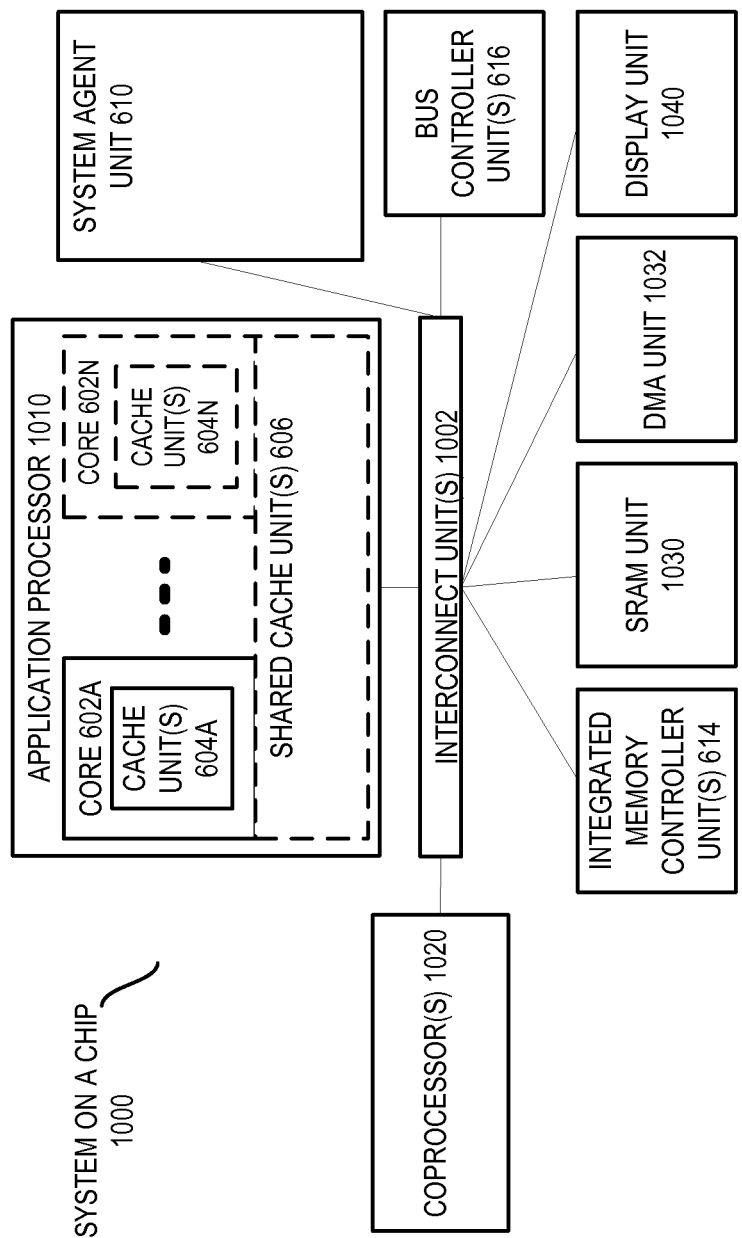
FIG. 10 illustrates a block diagram of a system on a chip (SoC) in accordance with an embodiment of the present invention.

Referring now to FIG. 10, shown is a block diagram of a SoC 1000 in accordance with an embodiment of the present invention. Similar elements in FIG. 6 bear like reference numerals. Also, dashed lined boxes are optional features on more advanced SoCs. In FIG. 10, an interconnect unit(s) 1002 is coupled to: an application processor 1010 which includes a set of one or more cores 202A-N and shared cache unit(s) 606; a system agent unit 610; a bus controller unit(s) 616; an integrated memory controller unit(s) 614; a set or one or more coprocessors 1020 which may include integrated graphics logic, an image processor, an audio processor, and a video processor; an static random access memory (SRAM) unit 1030; a direct memory access (DMA) unit 1032; and a display unit 1040 for coupling to one or more external displays. In one embodiment, the coprocessor(s) 1020 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 830 illustrated in FIG. 8, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 11:
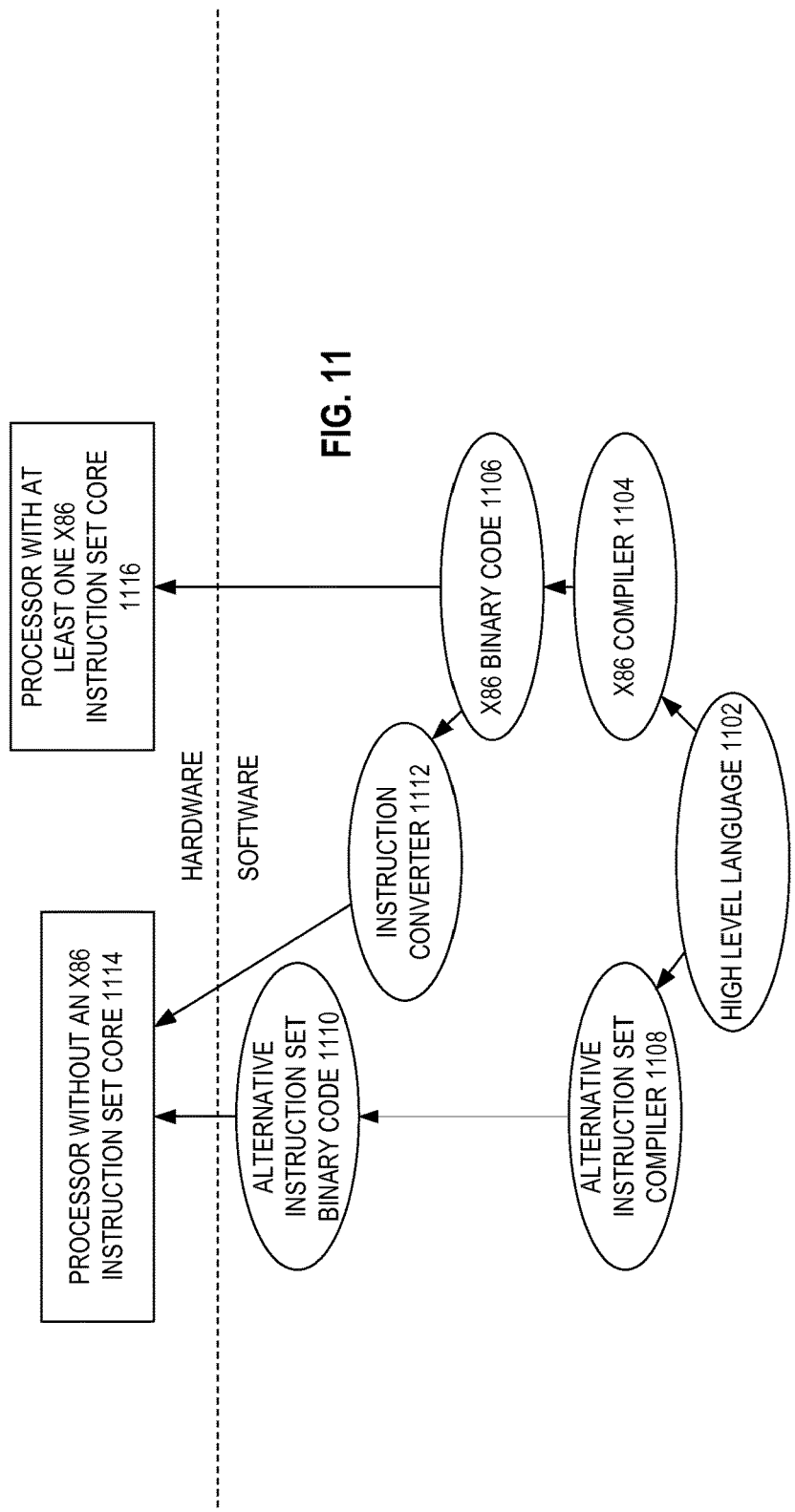
FIG. 11 illustrates a block diagram contrasting the use of a software instruction converter to convert binary instructions in a source instruction set to binary instructions in a target instruction set according to embodiments of the invention.

FIG. 11 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 11 shows a program in a high level language 1102 may be compiled using an x86 compiler 1104 to generate x86 binary code 1106 that may be natively executed by a processor with at least one x86 instruction set core 1116. The processor with at least one x86 instruction set core 1116 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1104 represents a compiler that is operable to generate x86 binary code 1106 (e.g., object code) that can, with or without additional linkage processing, be executed on the processor with at least one x86 instruction set core 1116. Similarly, FIG. 11 shows the program in the high level language 1102 may be compiled using an alternative instruction set compiler 1108 to generate alternative instruction set binary code 1110 that may be natively executed by a processor without at least one x86 instruction set core 1114 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1112 is used to convert the x86 binary code 1106 into code that may be natively executed by the processor without an x86 instruction set core 1114. This converted code is not likely to be the same as the alternative instruction set binary code 1110 because an instruction converter capable of this is difficult to make; however, the converted code will accomplish the general operation and be made up of instructions from the alternative instruction set. Thus, the instruction converter 1112 represents software, firmware, hardware, or a combination thereof that, through emulation, simulation or any other process, allows a processor or other electronic device that does not have an x86 instruction set processor or core to execute the x86 binary code 1106.

Method and Apparatus for a Parallel, Speculative Decompression Accelerator

One embodiment of the invention comprises a low area, high-throughput speculative DEFLATE decompression accelerator that leverages the converging nature of Huffman codes to enable parallel, out-of-order symbol decoding. DEFLATE is the most widely deployed lossless compression/decompression standard and is used in many software applications/libraries including, but not limited to, gzip, zlib, 7-zip, PNG, .ZIP etc. The DEFLATE operation is specified in its basic format in Request for Comments (RFC) 1951. While the embodiments of the invention described below focus on a DEFLATE decompression operation using Huffman coding, the underlying principles of the invention may be implemented on any form of prefix coding and may also be used in other forms of lossless compression algorithms.

The DEFLATE operation compresses raw data into a stream of literals and length+distance symbols that are subsequently Huffman encoded to achieve optimal compression. Each symbol is represented by a code varying in length from 1b-15b. Some of the length and distance codes require a variable number of additional bits (0-13b) from the payload that need concatenation with the Huffman decoded base during decompression. Hence, each compressed symbol can vary in length from 1b-28b. The variable length encoding along with the serial nature of DEFLATE algorithm makes it impossible to decode any subsequent symbol before processing the symbol that is the earliest in the compressed payload. This fundamental bottleneck of the algorithm limits decompression throughput on a single block to a theoretic 1 symbol/decode-cycle at best, irrespective of the number of cores and specialized hardware Huffman decoders available in a system.

The embodiments described below break the serial dependency of Huffman codes and enable parallel out-of-order DEFLATE decompression using index based check-pointing assisted speculation. These techniques can be deployed in both software as well as hardware to achieve DEFLATE decompression at rates much higher than the current limit of 1 symbol/decode-cycle. One embodiment described below achieves 1.9× higher throughput over conventional approach owing to its ability to decode two Huffman symbols per decode cycle. In addition, these techniques may be applied to speed up other forms of Huffman codes such as used in JPEG, MPEG, etc., or in other lossless compression algorithms.

One embodiment of the invention parallelizes the traditionally serial DEFLATE decompression process by launching a speculative decompression operation at a random starting point in the DEFLATE payload in addition to a real operation that starts from the beginning of the payload. The speculative operation generates a few incorrect symbols and subsequently converges to a genuine starting index, following which it starts generating correct symbols. Hence, by discarding the initial incorrect, speculative symbols genuine symbols can be decoded and cached ahead of time using the speculative operation concurrently with the real operation (which always generates the correct symbols).

Check-pointing the bit-index and code-type of the first cached speculative symbol, and comparing it with the advancing index of the real operation can accurately provide information about the correctness of the speculative symbol. In the event of a match of the indices and code-types, all speculative cached symbols commit, resulting in higher throughput. In the rare event of a mismatch, the cached symbols are flushed and a new speculation is launched. The speculative decoder leverages all the header processing computations done by the real engine and opportunistically uses most of the existing hardware (content addressable memory (CAM) tables, static random access memories (SRAMs), arithmetic logic unit (ALU)-based Huffman decoders, etc.) thereby resulting in minimal additional logic overhead and impact on the performance of the real decode. In one embodiment, in the event of a collision for using a hardware resource, the real decoder always gets higher priority than the speculative decoder. This allows multiple speculative decodes on a DEFLATE payload without slowing down the real decode process.

Figure 12:
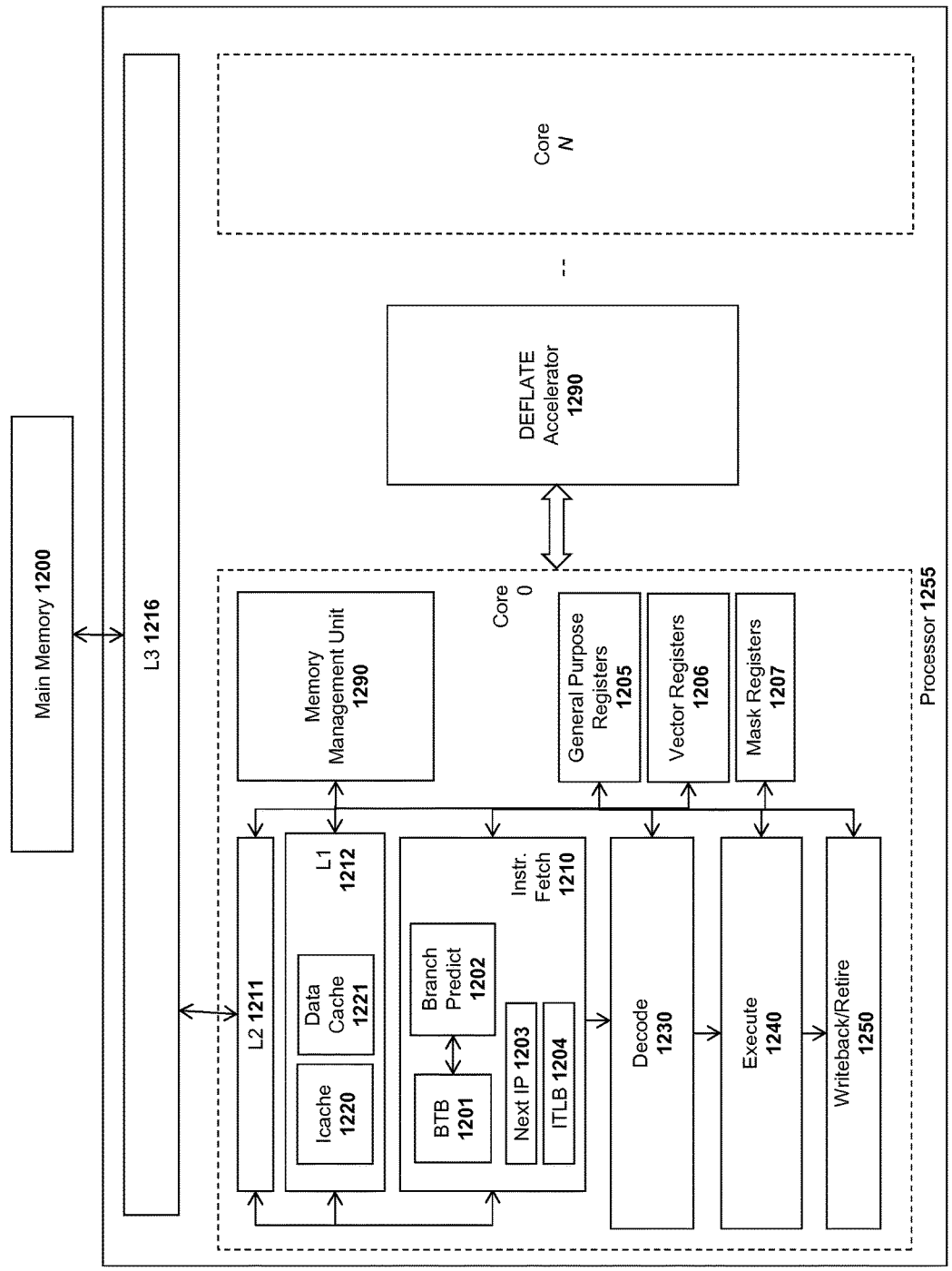
FIG. 12 illustrates an exemplary processor on which embodiments of the invention may be implemented.

FIG. 12 illustrates an exemplary processor 1255 on which embodiments of the invention may be implemented. A DEFLATE decompression accelerator 1290 is included within processor 1255 for performing the parallel, out-of-order deflate decompression operations described herein. In the embodiment shown in FIG. 12, a single DEFLATE accelerator 1290 is shared by all of the cores. In an alternate embodiment, each core includes its own instance of a DEFLATE accelerator 1290. In yet another embodiment, the DEFLATE accelerator 1290 may be implemented on a semiconductor chip separate from the semiconductor chip of the processor 1255, communicatively coupled to the processor over a communication link/bus. The underlying principles of the invention are not limited to any particular architectural arrangement for integrating the DEFLATE accelerator 1290 into a data processing system.

In one embodiment, each core 0-N of the processor 1255 includes a memory management unit 1290 for performing memory operations such as load/store operations. In addition, each core 0-N includes a set of general purpose registers (GPRs) 1205, a set of vector registers 1206, and a set of mask registers 1207. In one embodiment, multiple vector data elements are packed into each vector register 1206 which may have a 512 bit width for storing two 256 bit values, four 128 bit values, eight 64 bit values, sixteen 32 bit values, etc. However, the underlying principles of the invention are not limited to any particular size/type of vector data. In one embodiment, the mask registers 1207 include eight 64-bit operand mask registers used for performing bit masking operations on the values stored in the vector registers 1206 (e.g., implemented as mask registers k0-k7 described above). However, the underlying principles of the invention are not limited to any particular mask register size/type.

The details of a single processor core ("Core 0") are illustrated in FIG. 12 for simplicity. It will be understood, however, that each core of the processor 1255 may have the same set of logic as Core 0. For example, each core may include a dedicated Level 1 (L1) cache 1212 and Level 2 (L2) cache 1211 for caching instructions and data according to a specified cache management policy. The L1 cache 1212 includes a separate instruction cache 1220 for storing instructions and a separate data cache 1221 for storing data. The instructions and data stored within the various processor caches are managed at the granularity of cache lines which may be a fixed size (e.g., 64, 128, 512 Bytes in length). Each core of this exemplary embodiment has an instruction fetch unit 1210 for fetching instructions from main memory 1200 and/or a shared Level 3 (L3) cache 1216; a decode unit 1220 for decoding the instructions (e.g., decoding program instructions into micro-operatons or "uops"); an execution unit 1240 for executing the instructions; and a writeback unit 1250 for retiring the instructions and writing back the results.

The instruction fetch unit 1210 includes various well known components including a next instruction pointer 1203 for storing the address of the next instruction to be fetched from memory 1200 (or one of the caches); an instruction translation lookaside buffer (ITLB) 1204 for storing a map of recently used virtual-to-physical instruction addresses to improve the speed of address translation; a branch prediction unit 1202 for speculatively predicting instruction branch addresses; and branch target buffers (BTBs) 1201 for storing branch addresses and target addresses. Once fetched, instructions are then streamed to the remaining stages of the instruction pipeline including the decode unit 1230, the execution unit 1240, and the writeback unit 1250. The structure and function of each of these units is well understood by those of ordinary skill in the art and will not be described here in detail to avoid obscuring the pertinent aspects of the different embodiments of the invention.

Figure 13:
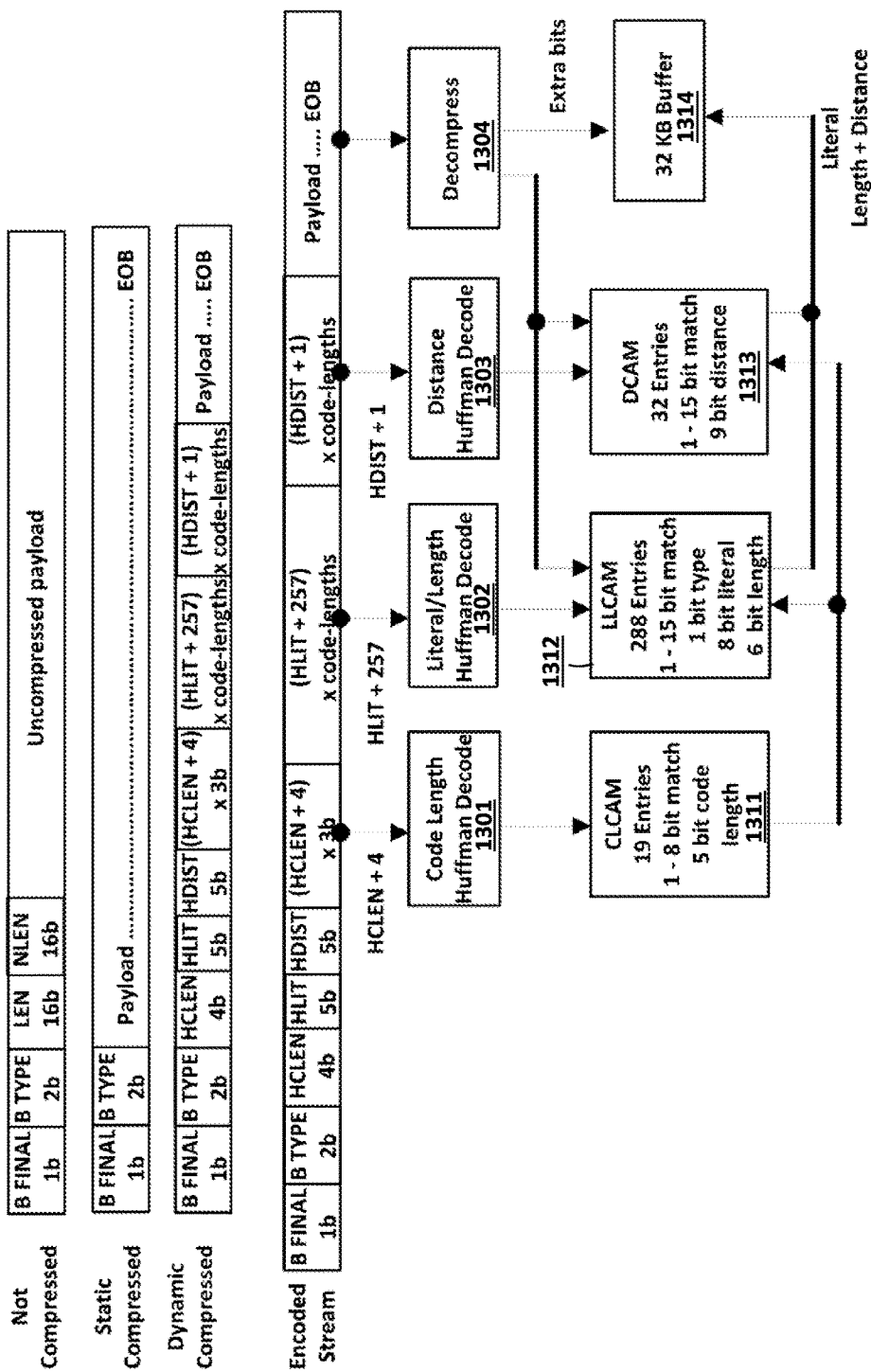
FIG. 13 illustrates exemplary architectural components used for performing Huffman decode operations.

FIG. 13 shows a block diagram of an exemplary DEFLATE decompression pipeline which includes code length Huffman decode logic 1301, literal/length Huffman decode logic 1302, distance Huffman decode logic 1303 and decompression logic 1304. One embodiment of DEFLATE uses the LZ77 algorithm along with the canonical Huffman prefix coding scheme to generate literals and length+distance pairs using references from a 32 KB history buffer. In one embodiment, the literal and length codes are placed together in a 288 entry literal and length (LL) CAM 1312 while the distance codes are stored in the 32 entry distance (D) CAM 1313. The literal/length and distance symbols are again Huffman encoded to achieve further compression. Information to decode the symbols is gathered from the payload header and stored in the 19 entry code length (CL) CAM 1311 by code length Huffman decode unit 1301. For every block of incoming compressed stream, the three CAMs 1311-1313 are populated following which literals or length+distance pairs are decoded and the original bitstream is recreated. Decoding symbols from the input stream and generating literal and length+distance codes is the performance critical loop in DEFLATE decompression. The sum of codelength and the extra number of bits that get picked from the payload is the actual number of bits that gets consumed in any particular decode cycle. The payload is shifted by the number of bits consumed to generate the next set of 15 bits for matching, and the CAM look-up process is repeated until the end-of-block (EOB) symbol is decoded. A new header is processed after EOB and all CAMs are repopulated before decoding the next block of compressed data.

FIG. 13 shows the format for the three possible types of blocks that make up a DEFLATE compressed stream. An uncompressed block can be skipped to get to the next block because its header contains information about its exact length. In contrast, a compressed block has to be fully decoded to locate its EOB symbol, before the next block can be processed. Besides, within a compressed block each symbol can vary in length from 1b-15b, and some symbols need an additional number of bits from the payload during decode. Absence of prior-information about the location of EOB symbol between blocks, and the variable length of symbols within a block makes DEFLATE decompression a completely serialized operation and extremely difficult to parallelize even with the availability of additional hardware resources. Techniques are described below (speculative Huffman decode) to break this serial dependency of Huffman coded symbols in the DEFLATE payload and expose the traditional decompression methodology to parallelization, thereby creating opportunity for dramatic improvements in throughput. In high-end computing systems like enterprise servers, these techniques can improve decompression throughput by an order of magnitude over current approaches by making it possible for multiple cores to work in parallel on any particular DEFLATE compressed stream.

Figure 14:
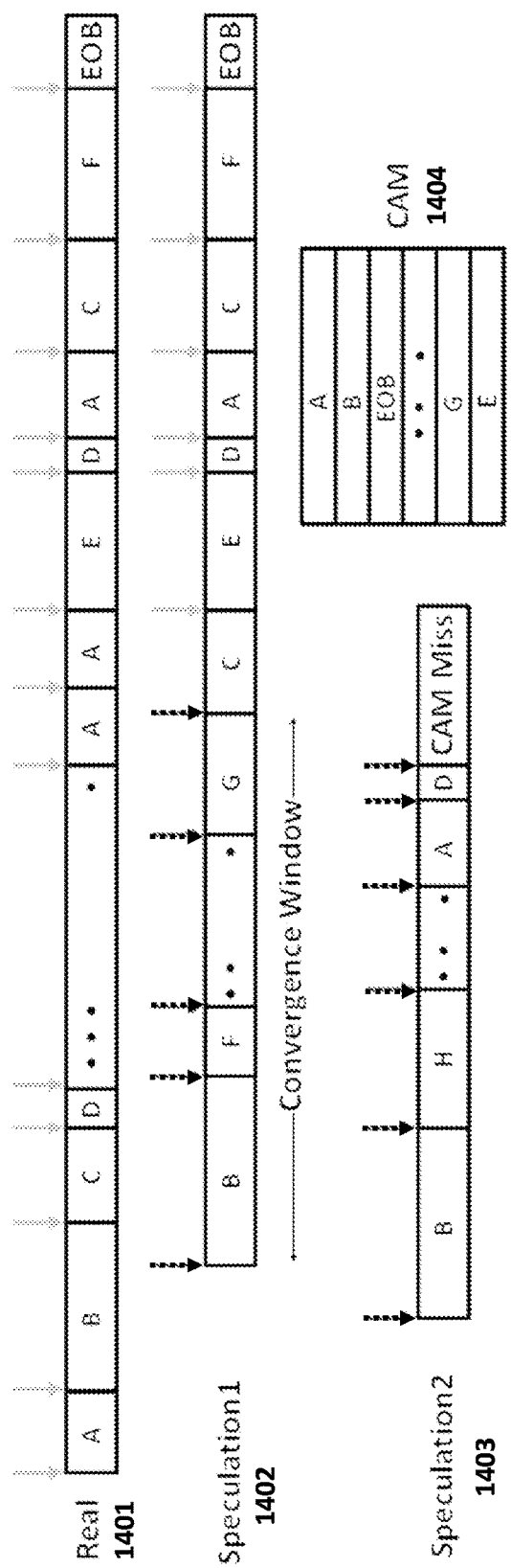
FIG. 14 illustrates exemplary speculative Huffman decode operations and a real Huffman decode operation.

For a given DEFLATE compressed payload, decompression consists of two key steps: CAM update and Huffman decode. Every new block's header is processed to generate Huffman codes unique to its symbols and these codes are populated into the literal/length and distance CAM tables. Following this during Huffman decode, the payload is matched against entries in the CAM. A computing operation that serially advances as per this standard protocol is called a real decode 1401 as shown on the top of FIG. 14. A real decoder generates one symbol per decode cycle with 100% accuracy. These accurate symbols (A, B, C etc. in FIG. 14) are marked with green arrows. In one embodiment of the invention, a speculative operation such as Speculation1 1402 or Speculation2 1403 is concurrently launched at a pre-defined offset from the real operation. The speculative decode uses the existing CAM 1404 tables and only proceeds with Huffman decode, without updating the CAM 1404 entries. Because the speculative decode starts from a random bit-index (which could possibly be part of a different block) it might miss in the CAM after advancing with a few matches or may never miss and advance until the end of the block. In the case of a CAM miss, all symbols decoded by the speculative decoder can be marked off as incorrect as indicated by dotted arrows in FIG. 14.

Figure 15:
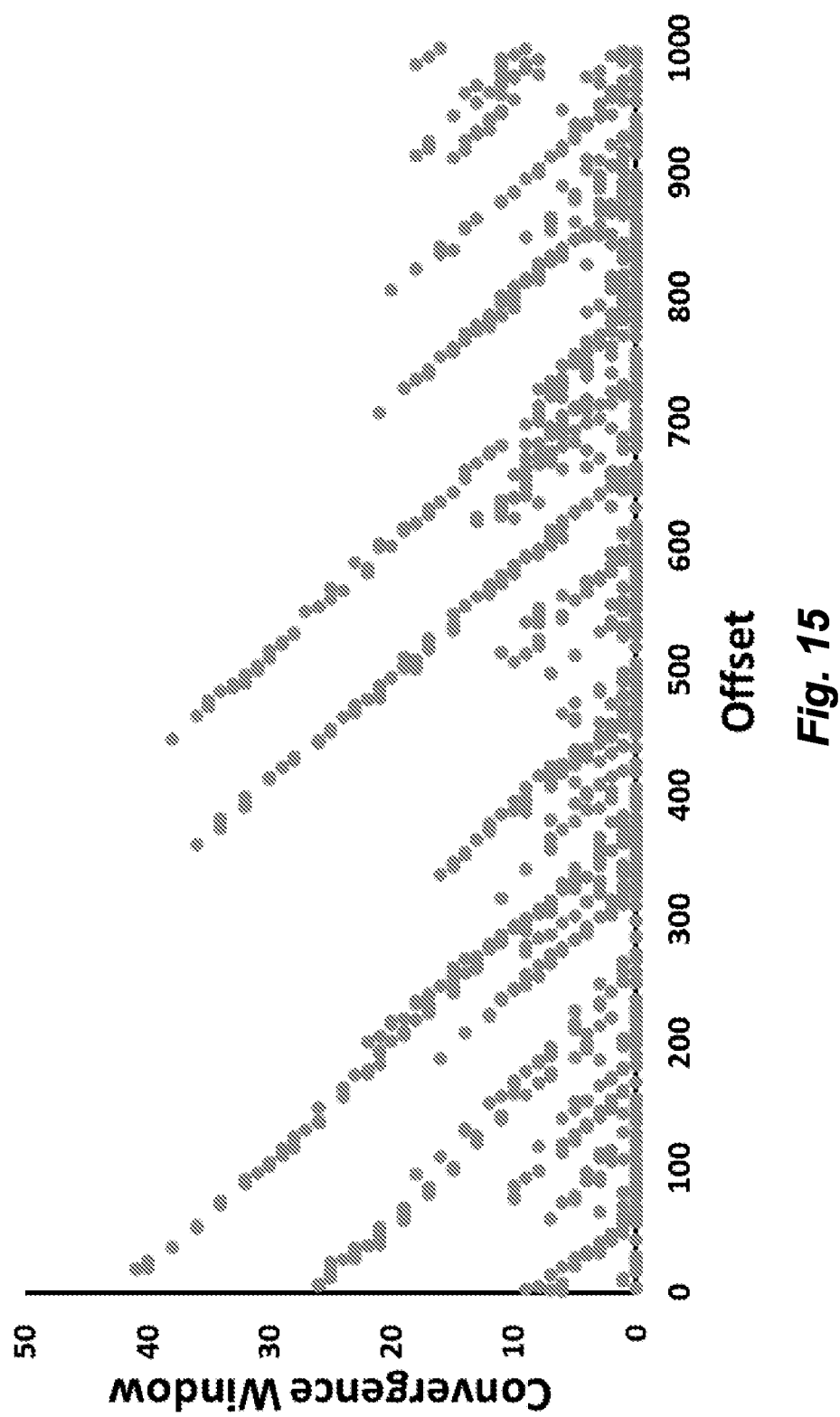
FIG. 15 illustrates exemplary convergence windows for speculative operations launched with varying bit-offsets.

For the situation where the speculative decoder reaches EOB as shown in Speculation1 1402, some of the initial symbols can be marked off as incorrect, as indicated by the dotted arrows, while the remaining ones can be marked as genuine accurate symbols. The number of cycles (assuming a symbol is decoded every cycle) following which a speculative decoder starts generating accurate symbols is termed as its convergence window. FIG. 15 illustrates exemplary convergence windows for 1000 speculative operations launched with varying bit-offsets (0 to 999) from a random location in the a the payload (obtained by compressing textual data).

Figure 16:
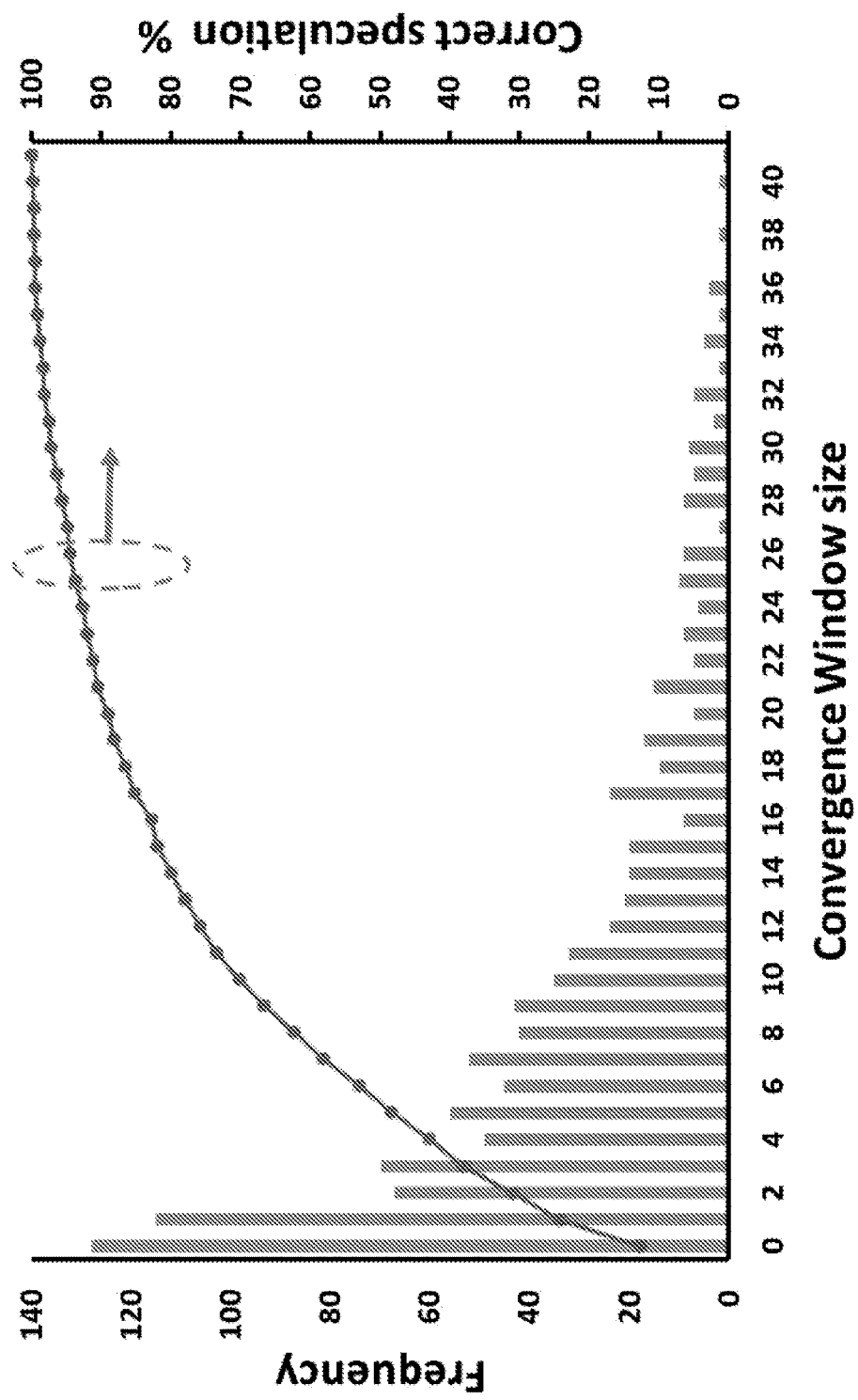
FIG. 16 illustrates exemplary frequency of occurrence of convergence windows varying from 0 to 41.

The plot in FIG. 15 shows that CAM misses are extremely rare. All 1000 speculative decodes converge and generate accurate symbols. More importantly, most operations converge relatively early. For the experimental 7-zip compressed data analyzed, convergence windows vary from 0 to 41 cycles. The plot in FIG. 16 shows the frequency of occurrence of convergence windows varying from 0 to 41. A window size of 0 indicates that a speculative decode was launched at the starting point of a genuine Huffman symbol, and hence it generated all subsequent symbols with 100% accuracy. A window of 41 indicates that only symbols generated onward the 41st symbol are accurate for the corresponding speculative decode. As evident from the plot, most decode operations converge early and the probability of long convergence window is very small. Hence, if a few initial symbols (higher than the convergence window) are discarded, speculative decode can continue to advance and generate 100% accurate symbols, thereby enabling parallel out-of-order decompression. The embodiments of the invention described herein exploit this converging nature of Huffman codes to extract parallelism while decompressing the DEFLATE payload. As shown in the dotted curve in FIG.

16, for the given experiment with a 20 cycle convergence window (first 20 symbols discarded) speculation is successful 90% of the time. This accounts for only a 0.1% repeat decode penalty for the block of 20,000 symbols used for this experiment.

Figure 17:
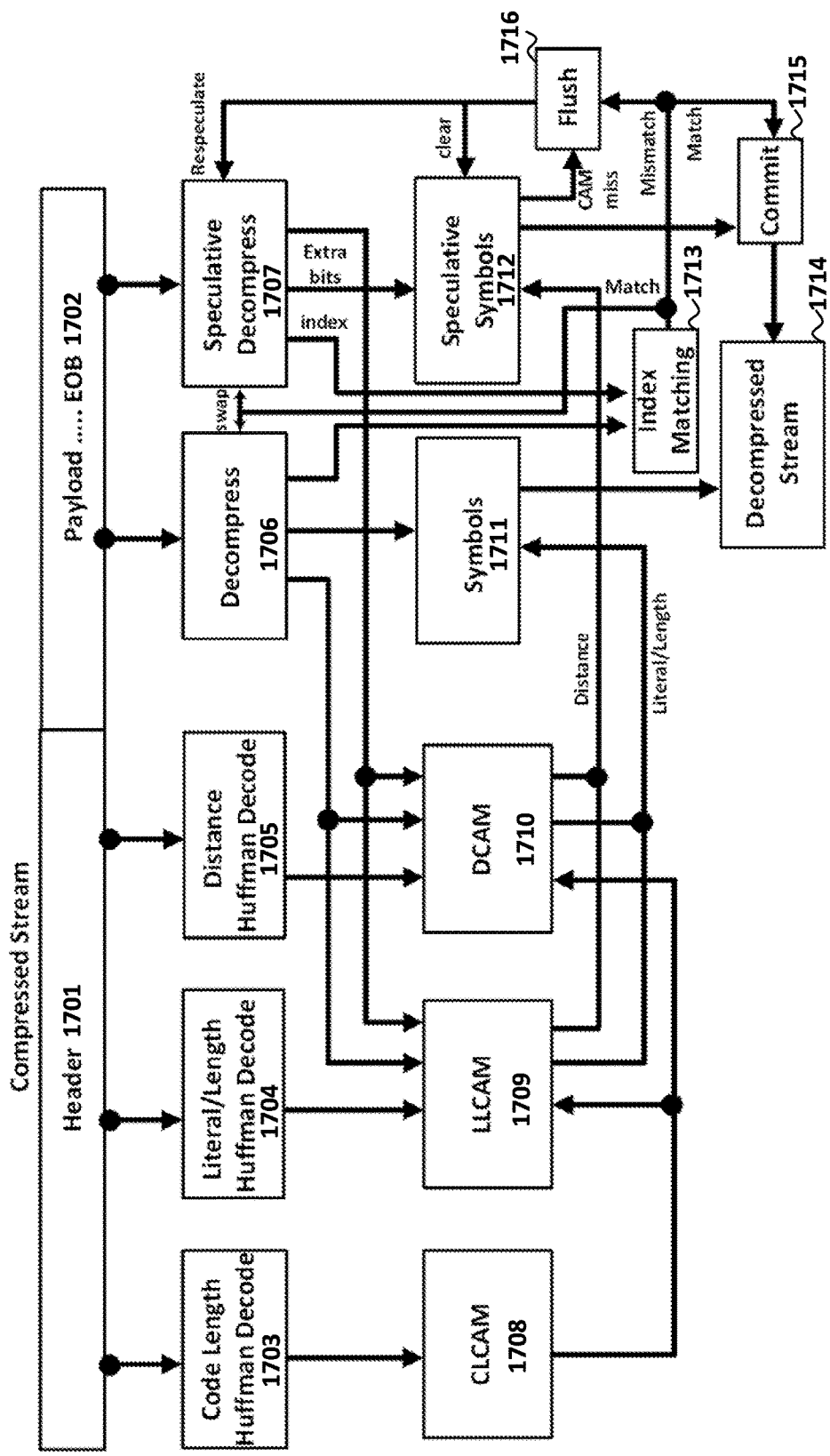
FIG. 17 illustrates one embodiment of an architecture for performing speculative decode operations.

FIG. 17 illustrates one embodiment of a micro-architecture of a two-way speculative CAM-based DEFLATE decompression hardware accelerator. In one embodiment, the accelerator comprises a primary decompression block 1706 and a speculative decompression block 1707 which work together along with code length Huffman decode block 1703, literal/length Huffman decode block 1704, and distance Huffman decode block 1705 to implement the techniques described herein. Thus, the design features two parallel Huffman decode data-paths, 1706 and 1707, that operate on the same DEFLATE block 1702 and access the same CAM tables (e.g., stored within LLCAM 1709 and DCAM 1710). The real data-path 1706 populates the CAM tables and advances sequentially from the very first symbol. Symbols 1711 generated from the real engine 1706 are consumed by the 32 kb buffer to create the decompressed stream 1714. In one embodiment, the speculative decompress engine 1707 initiates decode at a random (or predetermined) point mid-way in the payload 1702. The index and the symbol type (literal or length+distance) for the very first symbol after the convergence window are checkpointed in an index-matching buffer 1713. All subsequent speculative symbols 1712 are stored in a temporary buffer. In one embodiment, the index-matching buffer 1713 indicates a mis-match when the progressing index of decoder 1706 exceeds the check-pointed index of decoder 1707. If the index-matching buffer 1713 indicates a mismatch, then a flush unit 1716 causes speculative symbols 1712 to be cleared and a re-speculate signal may be provided to the speculative decompress engine 1707 to reattempt speculation (e.g., at a different point within the payload 1702). If the index-matching buffer 1713 indicates a match, then commit logic 1715 commits the results to the decompressed stream 1714.

Figure 18:
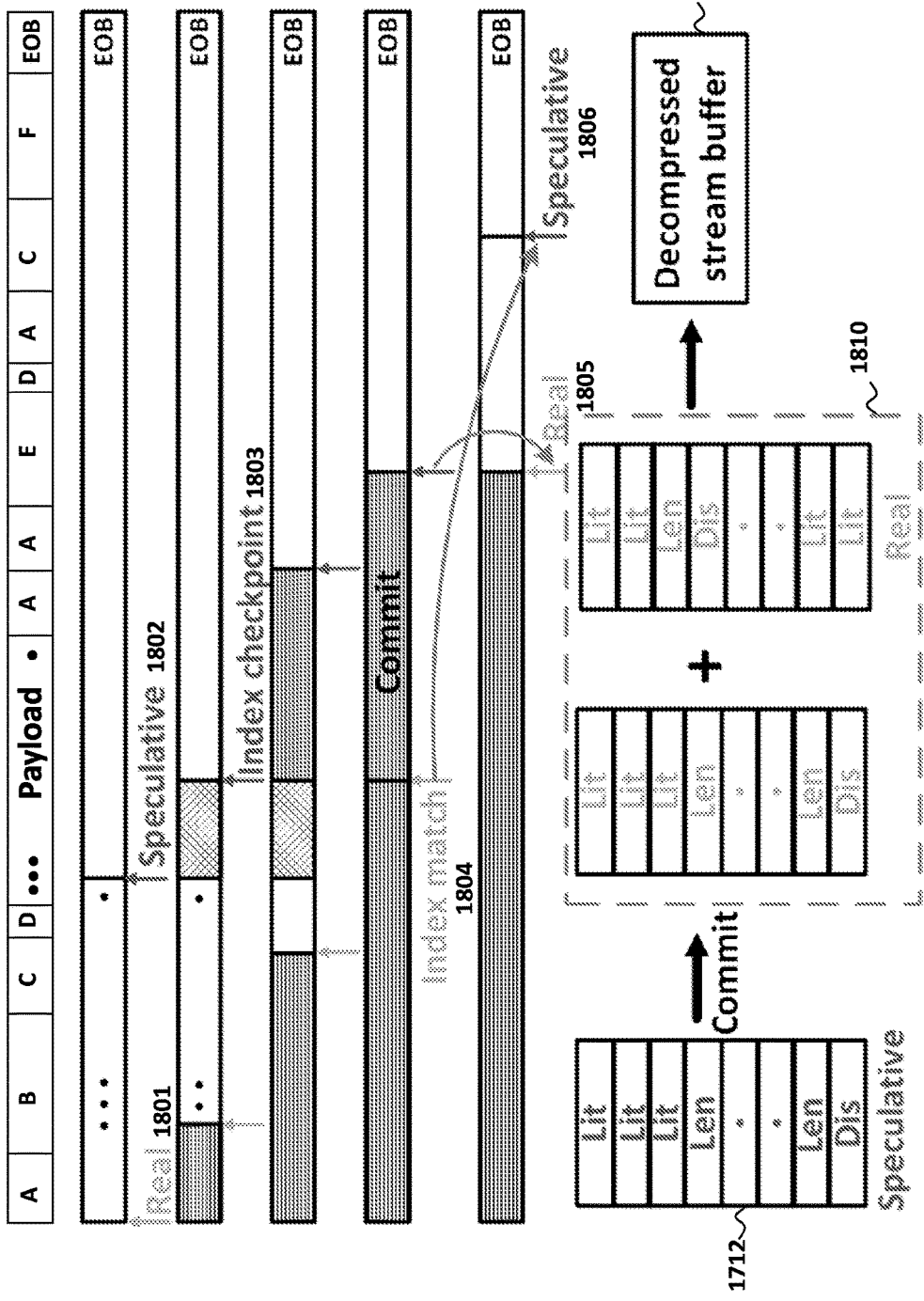
FIG. 18 illustrates the operation of real and speculative decode engines in accordance with one embodiment.

The operation of the real and speculative decode engines are illustrated in greater detail in FIG. 18, which shows the point 1801 at which the real engine begins processing and the point 1802 at which the speculative engine begins processing. Most often the real engine advances and subsequently overlaps the speculative engine's check-pointed bit index 1803. At this stage, indicated by index match point 1804, the real decoder validates the speculative decoder by comparing its decoded symbol type with the check-pointed one. In one embodiment, in case of a match as shown in FIG. 18, all speculative symbols in the temporary buffer 1712 (marked as Commit region in FIG. 18) commit and are consumed to update the decompressed stream buffer 1714 (i.e., combining the speculative and real results as shown at 1810). In one embodiment, the two decoders simultaneously swap roles. In particular, the speculative decoder operates as real at 1805 while the real decoder advances by a pre-defined offset and starts off a new speculative decode process at 1806.

This two-way look-ahead speculation with index check-pointing technique improves raw decompression throughput by 2x over an equally optimal design with no speculation. Although this embodiment includes decode flow for a system with one active speculation, the underlying principles of the invention may implement convergence window, index check-pointing and role-swapping on a system with multiple speculations.

Figure 19:
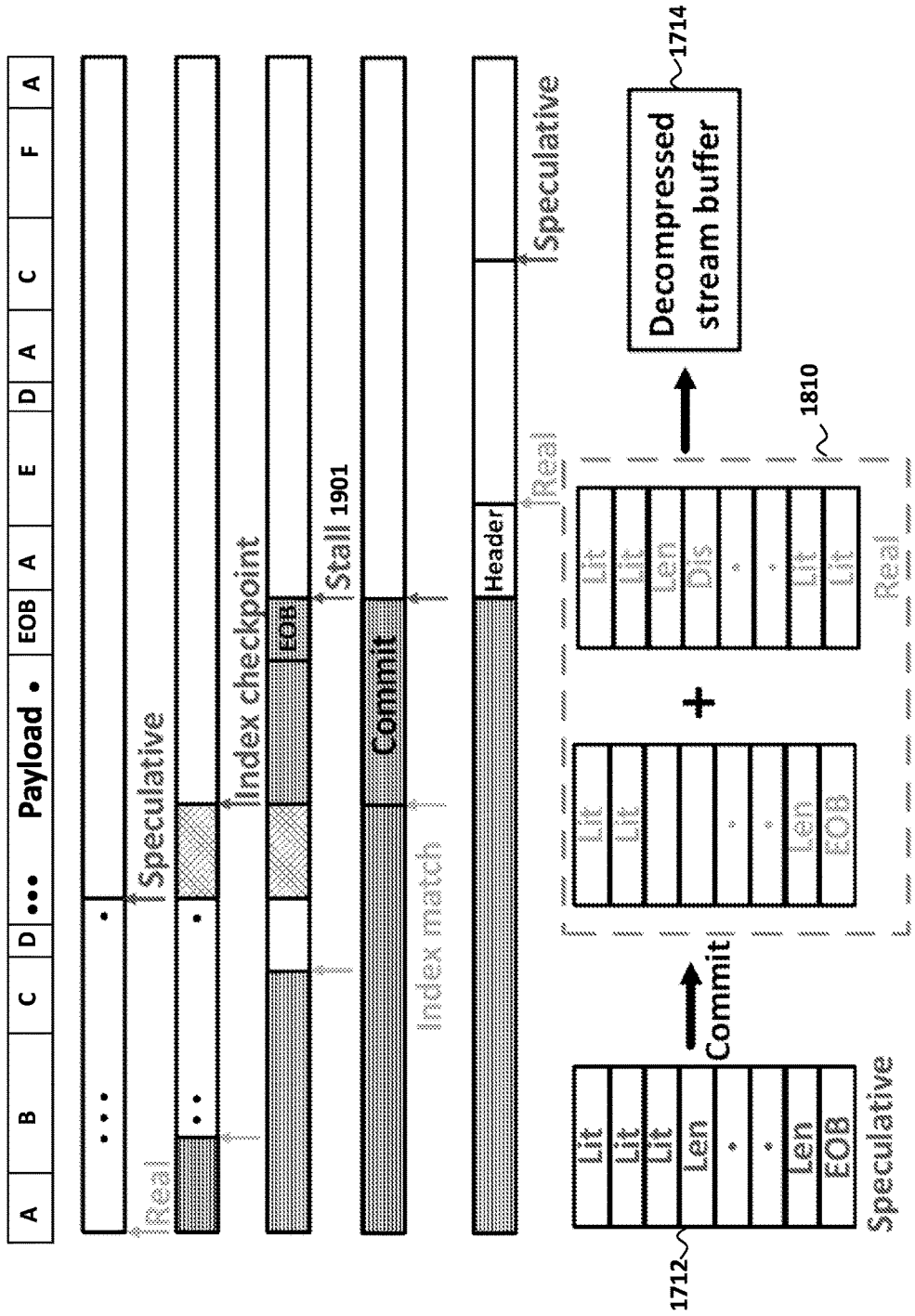
FIG. 19 illustrates one embodiment of the operation of real and speculative decode engines in which a stall occurs.

In one embodiment, in the event where the speculative operation encounters an EOB code as shown in FIG. 19, it stalls at point 1901 until the real decoder validates its symbols, following which they swap roles as previously described. In such a case, CAM labeled are loaded for processing the next block.

Figure 20:
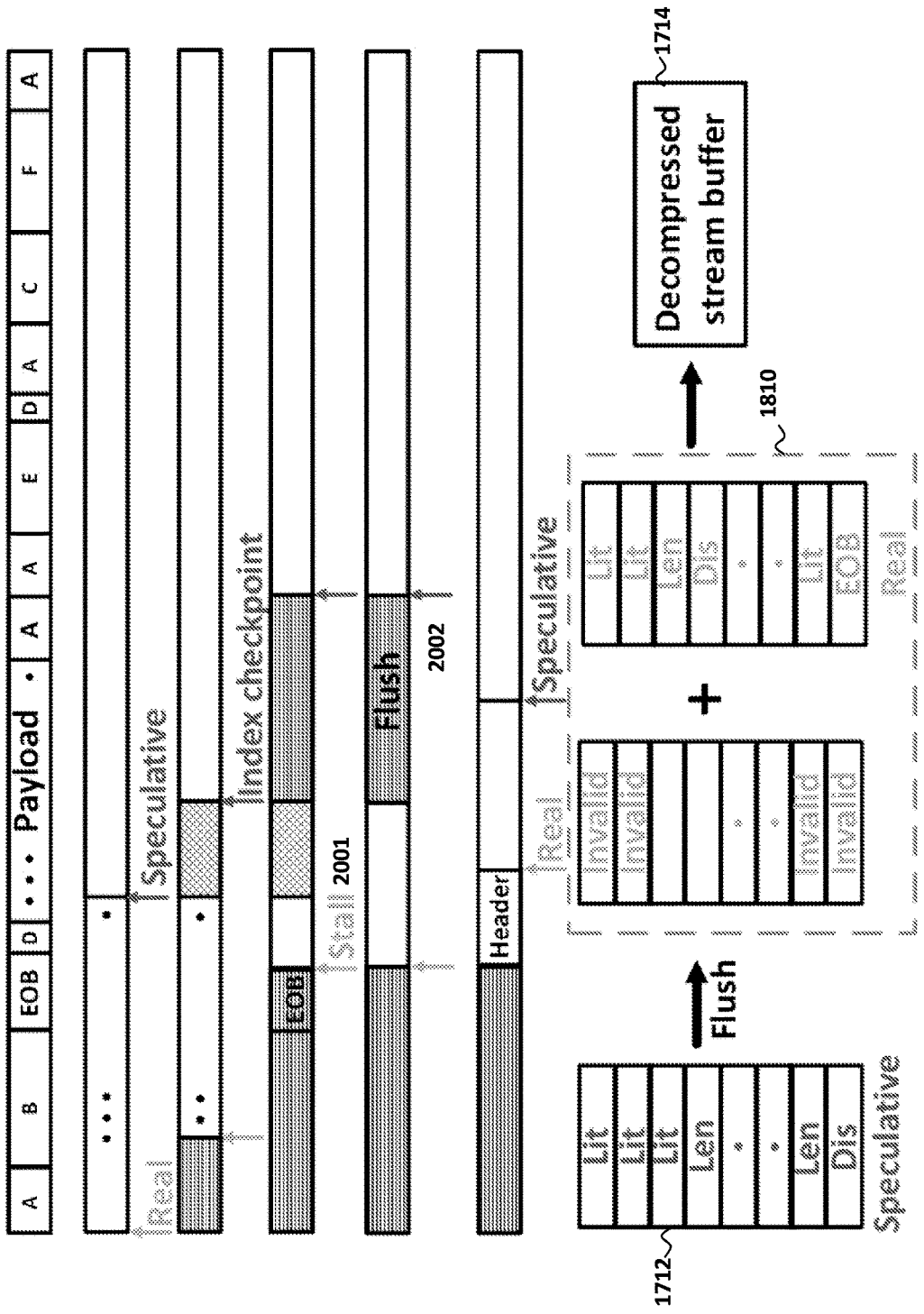
FIG. 20 illustrates another embodiment of the operation of real and speculative decode engines in which a stall occurs, followed by a flush.

In a similar event when the real decoder encounters EOB and stalls at 2001 as shown in FIG. 20, the speculative operation is flushed at 2002 by invalidating its check-pointed index and contents in the temporary buffer 1712 (as indicated by the invalid data shown in 1810). Following this, the header for the new block is processed, CAM tables are updated, and a new pair of real and speculative decodes are launched.

Figure 21:
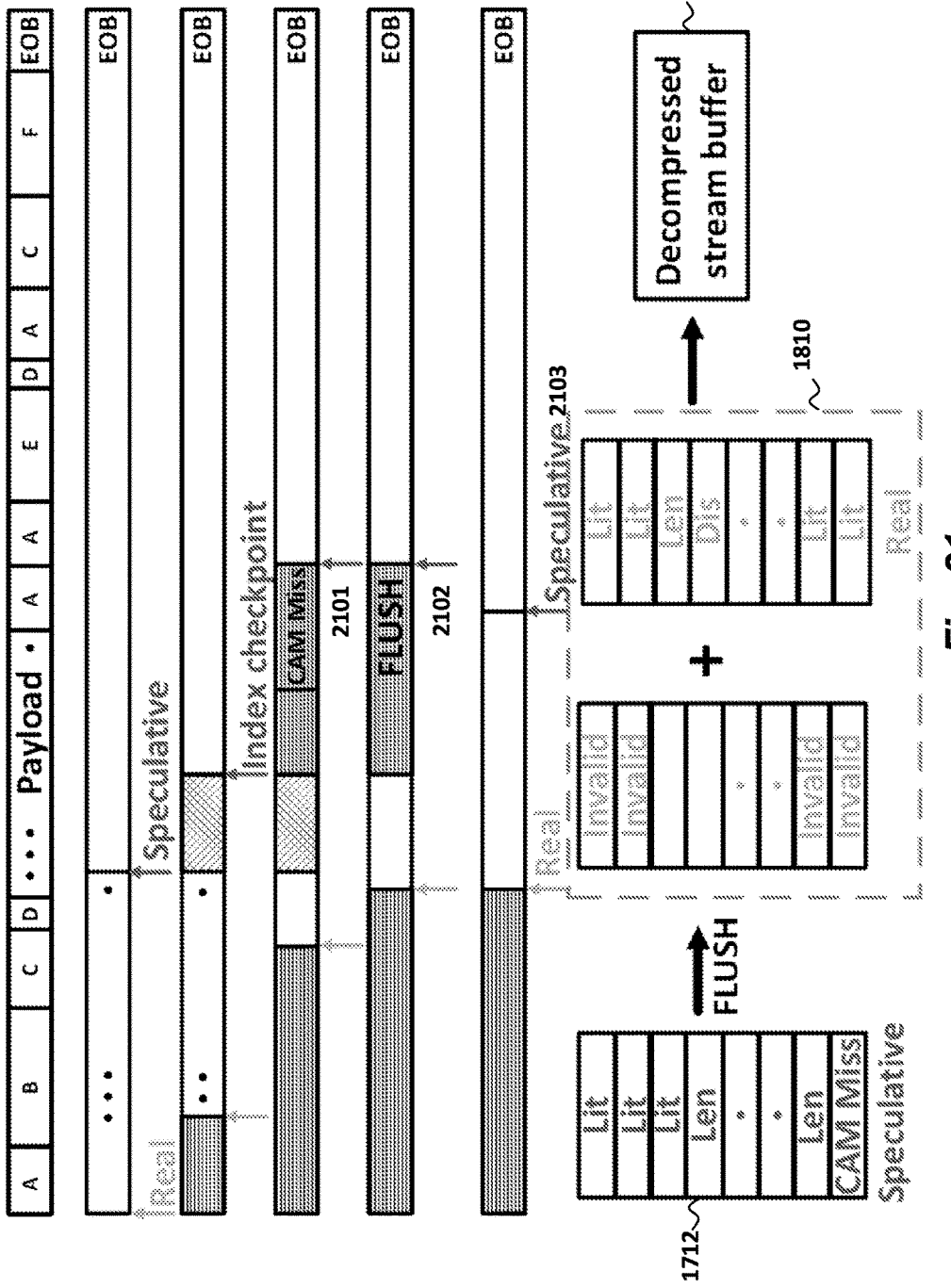
FIG. 21 illustrates an exemplary sequence of operations where speculative decode misses in the content addressable memory CAM, indicating that it's starting point was an invalid index.

As illustrated in FIG. 21, in a rare scenario where speculative decode misses in the CAM at 2101 indicating that it's starting point was an invalid index, it is flushed at 2102 in a similar way as described above and a new speculation relaunches at 2103.

Figure 22:
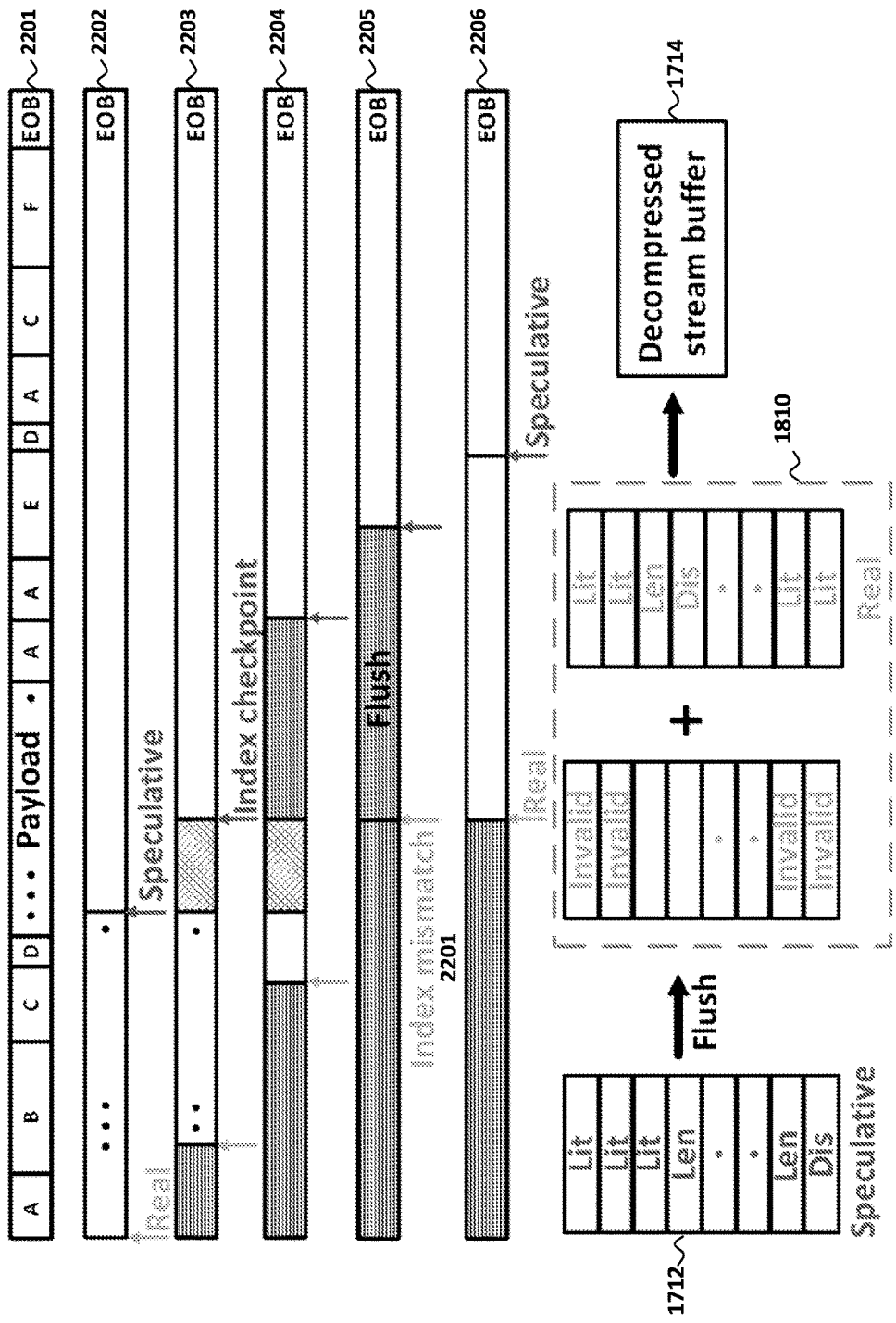
FIG. 22 illustrates an embodiment in which an index mismatch is generated resulting in a flush.

Another scenario, where speculative symbols need to be flushed is illustrated in FIG. 22 where the index of the real-decode goes past the check-pointed index without an overlap. An index mismatch is generated at 2201 resulting in a flush. Although in this design a speculative decode is check-pointed only once, there can be other variants where the speculative decode's indices are stored at multiple checkpoints. For such systems, a mismatch at the first checkpoint will only invalidate symbols decoded between the first and second checkpoints while allowing the speculative decode to progress. The speculative decode is flushed only when the last check-point fails.

In the embodiments described above, the speculative decode uses the same CAM tables as the non-speculative decode. Because these CAM tables constitute a major part of the hardware accelerator, the logic overhead for speculation is minimal compared to an approach that replicates the entire hardware for higher throughput. Parallel hardware can only operate on different decompressed streams and can't improve decompression throughput for a particular stream owing to the bottlenecks described above. For the two-way look-ahead speculative hardware accelerator described herein, the additional CAM port and check-pointing logic account for only 18% additional area overhead.

Figure 23:
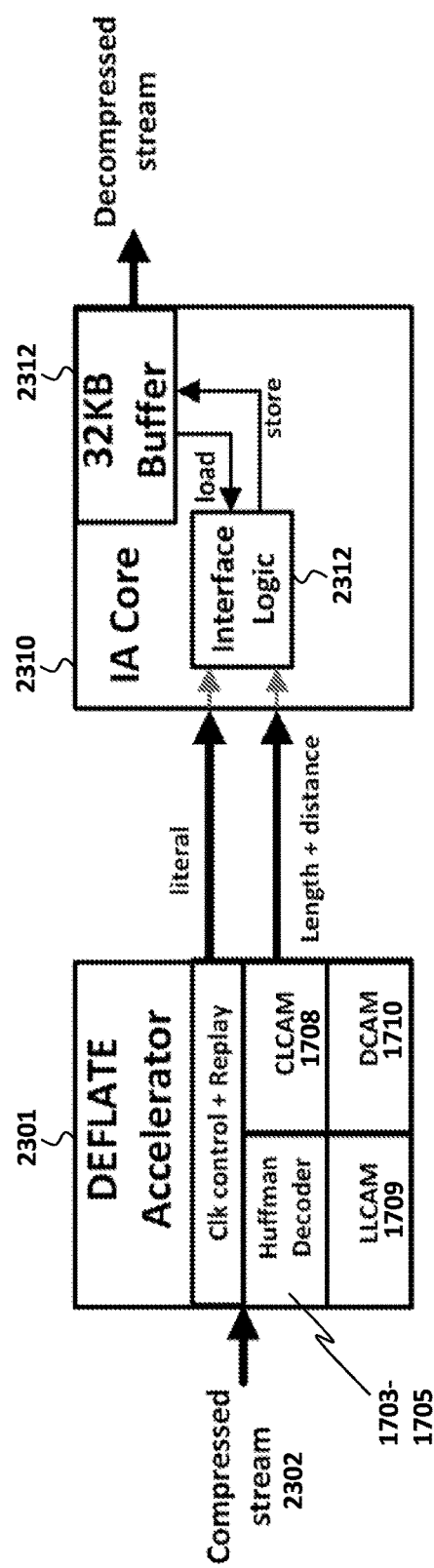
FIG. 23 illustrates an exemplary deflate accelerator implementing the techniques described herein, communicatively coupled to interface logic on a core.

FIG. 23 illustrates a usage model of one embodiment of the DEFLATE decompression accelerator 2301 which includes a Huffman decoder comprising code length Huffman decode block 1703, literal/length Huffman decode block 1704, and distance Huffman decode block 1705; and a CLCAM 1708, LLCAM 1709, and DCAM 1710 (described above). The accelerator takes an input compressed stream 2302 and generates "literal" and "length+distance" codes, that are consumed by the IA core 2310. The interface logic 2312 translates "literals" and "length+distance" codes into loads and store instructions that are sent to the history buffer 2312, that subsequently reconstructs the decompressed stream. Though a 32 KB buffer is shown in the diagram, different compression packages under different settings can use buffers of different sizes.

The embodiments of the invention provide numerous performance benefits over existing approaches. In fact, no current approach can decompress a DEFLATE payload at a rate higher than 1 symbol/decode-cycle, irrespective of the complexity of its hardware. The embodiments of the invention break the bottleneck presented by serially-dependent Huffman codes, and allow decoding multiple symbols in every decode-cycle. The look-ahead parallel out-of-order speculative hardware accelerator described herein improves raw decompression throughput by 1.9× over conventional designs with only 18% additional accelerator area overhead. Moreover, the generic nature of the techniques described herein makes them agnostic to any underlying hardware that the computing platform uses for Huffman decode (e.g., CAM, SRAM or ALU). Hence, this approach can be seamlessly leveraged in any existing system (that performs DEFLATE decompression) using software to exploit the full potential of its hardware to accelerate DEFLATE. For example, a quad-core system can use only one of its core at a time to process a DEFLATE block with the conventional approach. Using the approaches described above, three speculative decodes can be launched by using the remaining three idle cores in addition to real decode for potentially 3× higher throughput.

In the foregoing specification, the embodiments of invention have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. An deflate compression accelerator comprising:
   a non-speculative decompression circuit to perform a non-speculative decompression of a non-speculative portion of a deflate prefix code payload comprising a non-speculative plurality of symbols; and
   a speculative decompression circuit to perform speculative decompression of a speculative portion of the deflate prefix code payload comprising a speculative plurality of symbols concurrently with the non-speculative decompression performed by the non-speculative decompression circuit.

2. The apparatus as in claim 1 wherein the prefix code comprises a Huffman code.

3. The apparatus as in claim 2 further comprising:
   a code length (CL) Huffman decode circuit shared by the non-speculative and speculative decompression circuit, the CL Huffman decode module to perform CL decode operations on specified portions of a header of the Huffman code payload.

4. The apparatus as in claim 3 further comprising:
   a code length (CL) content addressable memory (CL-CAM) to store results generated by the CL Huffman decode circuit.

5. The apparatus as in claim 4 further comprising:
   a literal/length (LL) Huffman decode circuit shared by the non-speculative and speculative decompression modules, the CL Huffman decode circuit to perform LL decode operations on specified portions of the header of the Huffman code payload.

6. The apparatus as in claim 5 further comprising:
   a literal/length (LL) content addressable memory (LL-CAM) to store results generated by the LL Huffman decode circuit.

7. The apparatus as in claim 6 further comprising:
   a distance Huffman decode module shared by the non-speculative and speculative decompression circuit, the distance Huffman decode circuit to perform distance decode operations on specified portions of the header of the Huffman code payload.

8. The apparatus as in claim 7 further comprising:
   a distance (D) content addressable memory (DCAM) to store results generated by the distance Huffman decode circuit.

9. The apparatus as in claim 1 wherein the speculative decompression circuit begins decompression at a random starting point within the prefix code payload and wherein the non-speculative decompression module begins decompression at the beginning of the prefix code payload.

10. The apparatus as in claim 9 wherein the speculative decompression circuit initially generates a number of incorrect speculative symbols during decompression and subsequently converges to a genuine starting index, following which it starts generating correct symbols.

11. The apparatus as in claim 10 wherein the speculative decompression circuit discards the initially generated incorrect speculative symbols.

12. The apparatus as in claim 11 further comprising:
an index matching circuit to compare a bit-index and code-type of a non-speculative speculative symbol with that of a non-speculative symbol and, in response to detecting a match, the index matching circuit to cause the speculative symbols to be combined with the non-speculative symbols in a final decompressed stream.

13. The apparatus as in claim 12 wherein, in response to detecting a mis-match, the index matching circuit is configured to flush the speculative symbols.

14. The apparatus as in claim 13 wherein, in response to a mis-match, the non-speculative decompression circuit continues to generate non-speculative symbols and the speculative decompression circuit restarts at a another random location within the prefix code payload ahead of the non-speculative decompression module.

15. The apparatus as in claim 12 wherein following the combination of the speculative symbols with the non-speculative symbols in the final compressed stream, the non-speculative decompression circuit is to perform a speculative decompression of a third portion of a prefix code payload comprising a third plurality of symbols and the speculative decompression circuit is to perform non-speculative decompression of a fourth portion of the prefix code payload comprising a fourth plurality of symbols concurrently with the speculative decompression performed by the non-speculative decompression circuit.

16. The apparatus as in claim 1 further comprising:
one or more additional decompression circuits to perform speculative decompression of one or more additional portions of the prefix code payload comprising one or more additional sets of symbols concurrently with the non-speculative decompression performed by the non-speculative compression circuit and the speculative decompression performed by the speculative decompression circuit.

17. The apparatus as in claim 16 wherein the speculative decompression circuit performs decompression on the speculative portion of the prefix code payload at a non-speculative offset from the non-speculative portion of the prefix code payload and wherein the one or more additional decompression circuits perform decompression on the one or more additional portions of the prefix code payload at one or more additional offsets from the non-speculative portion of the prefix code payload.

* * * * *